(12) United States Patent
Li et al.

(10) Patent No.: US 11,568,954 B2
(45) Date of Patent: Jan. 31, 2023

(54) TECHNIQUE TO PROACTIVELY IDENTIFY POTENTIAL UNCORRECTABLE ERROR CORRECTION MEMORY CELLS AND COUNTERMEASURE IN FIELD

(71) Applicant: SanDisk Technologies LLC, Addison, TX (US)

(72) Inventors: Liang Li, Shanghai (CN); Ming Wang, Shanghai (CN)

(73) Assignee: SanDisk Technologies LLC, Addison, TX (US)

( * ) Notice: Subject to any disclaimer, the term of this patent is extended or adjusted under 35 U.S.C. 154(b) by 83 days.

(21) Appl. No.: 16/914,653

(22) Filed: Jun. 29, 2020

(65) Prior Publication Data

US 2021/0398604 A1 Dec. 23, 2021

(30) Foreign Application Priority Data

Jun. 18, 2020 (CN) .......................... 202010558033.3

(51) Int. Cl.
  *G11C 29/00* (2006.01)
  *G11C 16/04* (2006.01)
  *G11C 16/10* (2006.01)
  *G11C 16/16* (2006.01)
  *G11C 16/34* (2006.01)
  *G06F 11/10* (2006.01)
  (Continued)

(52) U.S. Cl.
  CPC ........ *G11C 29/883* (2013.01); *G06F 11/1068* (2013.01); *G11C 16/0483* (2013.01); *G11C 16/10* (2013.01); *G11C 16/16* (2013.01); *G11C 16/3445* (2013.01); *G11C 16/3459* (2013.01); *H01L 27/11556* (2013.01); *H01L 27/11582* (2013.01)

(58) Field of Classification Search
  None
  See application file for complete search history.

(56) References Cited

U.S. PATENT DOCUMENTS 7,023,736 B2 4/2006 Cernea et al.
7,046,568 B2 5/2006 Cernea
(Continued)

FOREIGN PATENT DOCUMENTS

JP  2008159185 A  *  7/2008  ........... G11C 29/028
TW  202042239 A  *  11/2020  ......... G06F 12/0246

*Primary Examiner* — Guerrier Merant
(74) *Attorney, Agent, or Firm* — Dickinson Wright PLLC; Steven C. Hurles

(57) ABSTRACT

A memory apparatus and method of operation is provided. The apparatus has blocks each including non-volatile storage elements. Each of the non-volatile storage elements stores a threshold voltage representative of an element data. The apparatus also includes one or more managing circuits configured to erase at least one of the blocks in an erase operation and program the element data in a program operation. The one or more managing circuits are also configured to proactively identify ones of the blocks as potential bad blocks and selectively apply stress to the ones of the blocks identified as the potential bad blocks and determine whether the potential bad blocks should be retired from the erase and program operations and put in a grown bad block pool or released to a normal block pool used for the erase and program operations based on a judgment after selectively applying the stress.

17 Claims, 17 Drawing Sheets

(51) Int. Cl.
*H01L 27/11582* (2017.01)
*H01L 27/11556* (2017.01)

(56) References Cited

U.S. PATENT DOCUMENTS

| | | |
|---|---|---|
| 7,196,928 B2 | 3/2007 | Chen |
| 7,196,931 B2 | 3/2007 | Cernea et al. |
| 7,327,619 B2 | 2/2008 | Chan et al. |
| 9,934,872 B2 * | 4/2018 | Magia ................ G11C 16/349 |
| RE47,226 E * | 2/2019 | Mokhlesi ........... G11C 16/0483 |
| 2009/0251970 A1 * | 10/2009 | Yamashita ............ G11C 16/28 |
| | | 365/185.18 |
| 2011/0320688 A1 * | 12/2011 | Lee .................... G06F 12/0246 |
| | | 711/E12.008 |
| 2013/0308402 A1 * | 11/2013 | Mu ................. G11C 29/50016 |
| | | 365/201 |
| 2014/0369129 A1 * | 12/2014 | Dutta ................ G11C 16/3418 |
| | | 365/185.17 |
| 2021/0118519 A1 * | 4/2021 | Muchherla ......... G11C 29/4401 |

\* cited by examiner

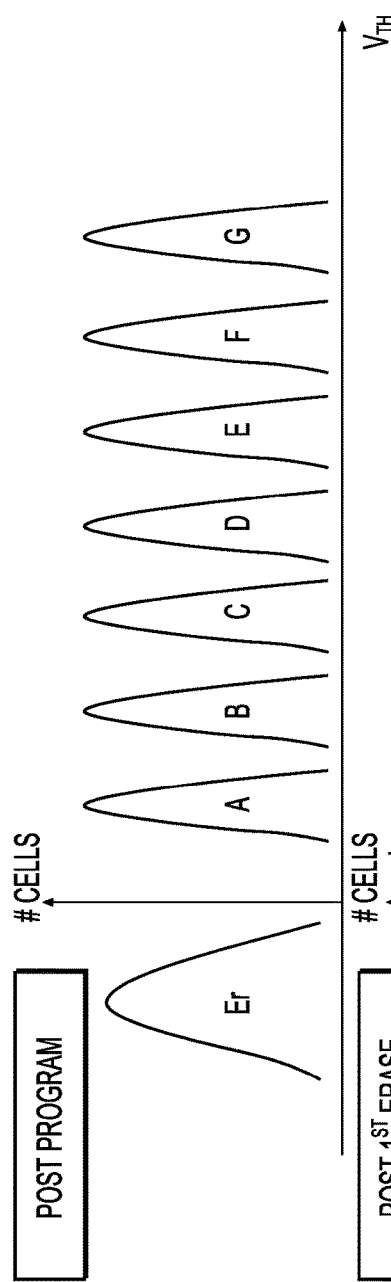
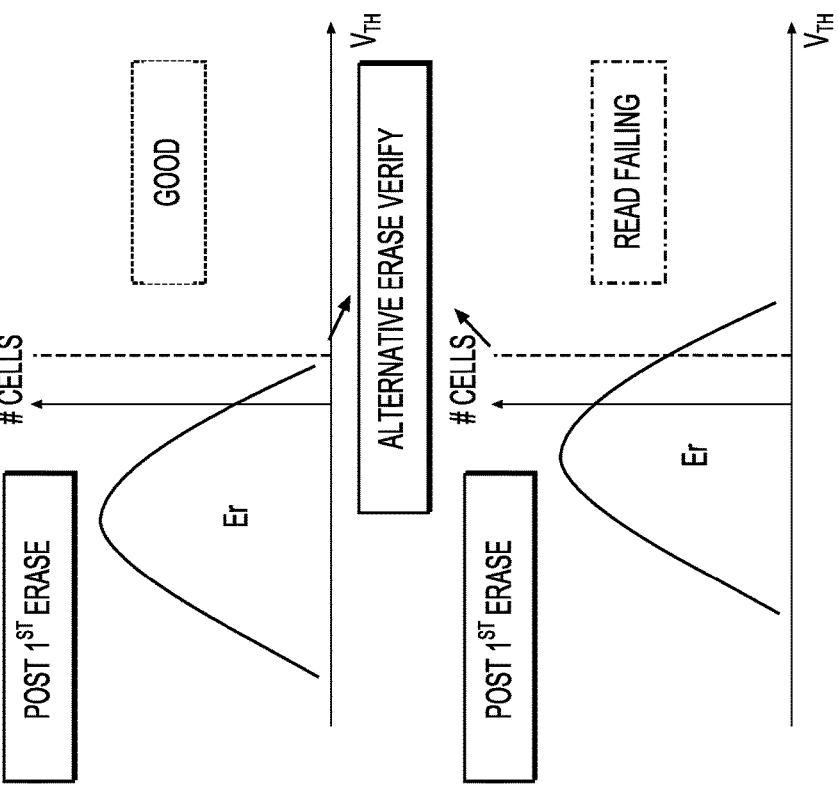
FIG. 12A
FIG. 12B
FIG. 12C

TECHNIQUE TO PROACTIVELY IDENTIFY POTENTIAL UNCORRECTABLE ERROR CORRECTION MEMORY CELLS AND COUNTERMEASURE IN FIELD

CROSS REFERENCE TO RELATED APPLICATION

This application claims priority to and the benefit of CN Application Serial No. 202010558033.3, filed Jun. 18, 2020, the entire disclosure of which is incorporated herein by reference.

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some non-volatile memory utilizes a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some non-volatile memory utilizes a charge trapping layer to store information. One such example has an oxide-nitride-oxide (ONO) region, in which the nitride (e.g., SiN) serves as a charge trapping layer to store information. When such a memory cell is programmed, electrons are stored in the charge trapping layer.

Non-volatile memory could have a 2D architecture or a 3D architecture. Ultra high density storage devices have been employed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. The conductor layers may function as word lines. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A back gate may surround the pipe connection to control conduction of the pipe connection. Control gates of the memory cells are provided by the conductor layers.

Prior to programming certain non-volatile memory devices, such as a NAND flash memory device, the memory cells are typically erased. The erase operation removes electrons from the floating gate, for some devices. For other devices, the erase operation removes electrons from the charge trapping layer.

Following manufacturing, short circuits may exist between the memory hole and the word lines or conductor layers or between the word lines and a local interconnect extending in parallel with the memory holes. Such defects can result in NAND dysfunction such as erasing, programming, and reading the memory cells and possibly lead to data loss.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide an apparatus having a plurality of blocks each including a group of non-volatile storage elements. Each of the group of non-volatile storage elements stores a threshold voltage representative of an element data. The apparatus also includes one or more managing circuits in communication with the plurality of blocks. The one or more managing circuits are configured to erase at least one of the plurality of blocks in an erase operation and program the element data in a program operation. The one or more managing circuits are also configured to proactively identify ones of the plurality of blocks as potential bad blocks and selectively apply stress to the ones of the plurality of blocks identified as the potential bad blocks and determine whether the potential bad blocks should be retired from the erase and program operations and put in a grown bad block pool or released to a normal block pool used for the erase and program operations based on a judgment after selectively applying the stress.

According to another aspect of the disclosure a controller in communication with a memory apparatus having a plurality of blocks each including a group of non-volatile storage elements is also provided. Each of the group of non-volatile storage elements stores a threshold voltage representative of an element data. The controller is configured to instruct the memory apparatus to erase at least one of the plurality of blocks in an erase operation and program the element data in a program operation. The controller is also configured to proactively identify ones of the plurality of blocks as potential bad blocks and instruct the memory apparatus to selectively apply stress to the ones of the plurality of blocks identified as the potential bad blocks. The controller then determines whether the potential bad blocks should be retired from the erase and program operations and put in a grown bad block pool or released to a normal block pool used for the erase and program operations based on a judgment after selectively applying the stress.

According to an additional aspect of the disclosure a method of operating a memory apparatus having a plurality of blocks each including a group of non-volatile storage elements is additionally provided. Each of the group of non-volatile storage elements stores a threshold voltage representative of an element data. The method includes the step of erasing at least one of the plurality of blocks in an erase operation and program the element data in a program operation. The method continues with the step of proactively identifying ones of the plurality of blocks as potential bad blocks and selectively applying stress to the ones of the plurality of blocks identified as the potential bad blocks and determining whether the potential bad blocks should be retired from the erase and program operations and put in a grown bad block pool or released to a normal block pool used for the erase and program operations based on a judgment after selectively applying the stress.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 12A shows threshold voltage distributions for a memory cell array when each memory cell stores three bits of data in eight physical or memory states after the program operation according to aspects of the disclosure;

FIGS. 12B and 12C show threshold voltage distributions for a memory cell array following a first one of the plurality of erase voltage pulses used during an erase operation according to aspects of the disclosure;

DETAILED DESCRIPTION

Figure 1A:
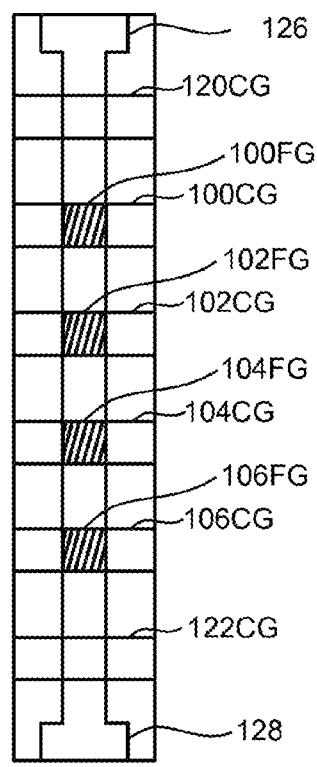
FIG. 1A is a top view of a NAND string according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of forming of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

During a program operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming pulses until the programming is completed. Next, a second word line, WL1, is programmed using one or more programming pulses until the programming is completed, and so forth. A programming pulse may include a set of increasing program voltages which are applied to the word line in respective program loops or program-verify iterations. Verify operations or stages may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 8A). In a three-bit per cell memory device, there are eight data states including the erased state and seven higher data states referred to as the A, B, C, D, E, F and G data states. In a four-bit per cell memory device, there are sixteen data states including the erased state and fifteen higher data states.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the threshold voltage Vt or Vth of the memory cell exceeds the read voltage. The read voltages are set at levels which are expected to be between the threshold voltage levels of adjacent data states.

In 3D memory structures, for example, short circuits may exist in between word lines and structures that form and connect to the memory cells. These short circuits can vary in severity, and while more severe short circuits may be caught during quality checks during manufacturing, less severe short circuits can result in data loss or issues in erasing, programming, and reading the memory cells during customer use in the field.

Figure 1B:
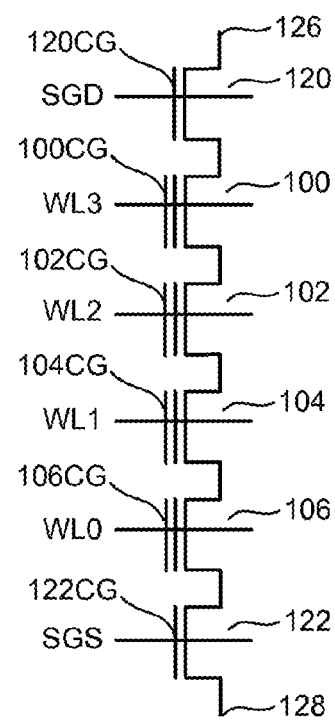
FIG. 1B is an equivalent circuit diagram of the NAND string of FIG. 1A according to aspects of the disclosure.

Techniques disclosed herein may be applied to 3D NAND, but are not necessarily limited thereto. A NAND flash memory structure may arrange multiple transistors in series between two select gates. The transistors in series and the select gates are referred to as a NAND string. FIG. 1A is a top view showing one NAND string. FIG. 1B is an equivalent circuit thereof. The NAND string depicted in FIGS. 1A and 1B includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 2:
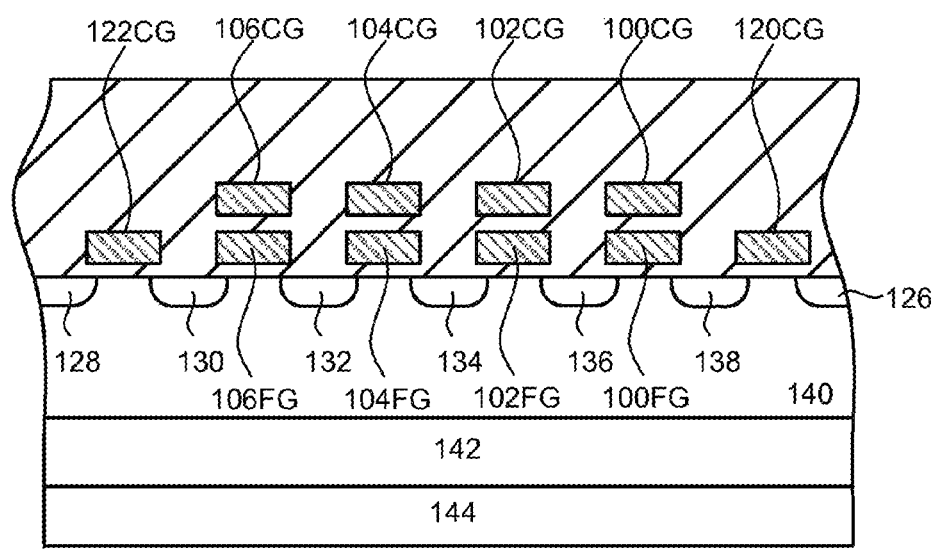
FIG. 2 is a cross-sectional view of the NAND string of FIG. 1A according to aspects of the disclosure.

FIG. 2 provides a cross-sectional view of one embodiment of the NAND string described above. FIG. 2 is for a 2D NAND string formed in a substrate. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1A-2 show four memory cells in the NAND string, the use of four transistors is provided only as an example. A NAND string used with the technology described herein can have less than four memory cells or more than four memory cells. For example, some NAND strings will include 8, 16, 32, 64 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0V to the control gate, the memory cell will turn on to indicate logic one is being stored. When the threshold voltage is positive and a read operation is attempted by applying 0V to the control gate, the memory cell will not turn on, which indicates that logic zero is stored.

A memory cell can also store multiple states, thereby storing multiple bits of digital data. When storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used with the present technology.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
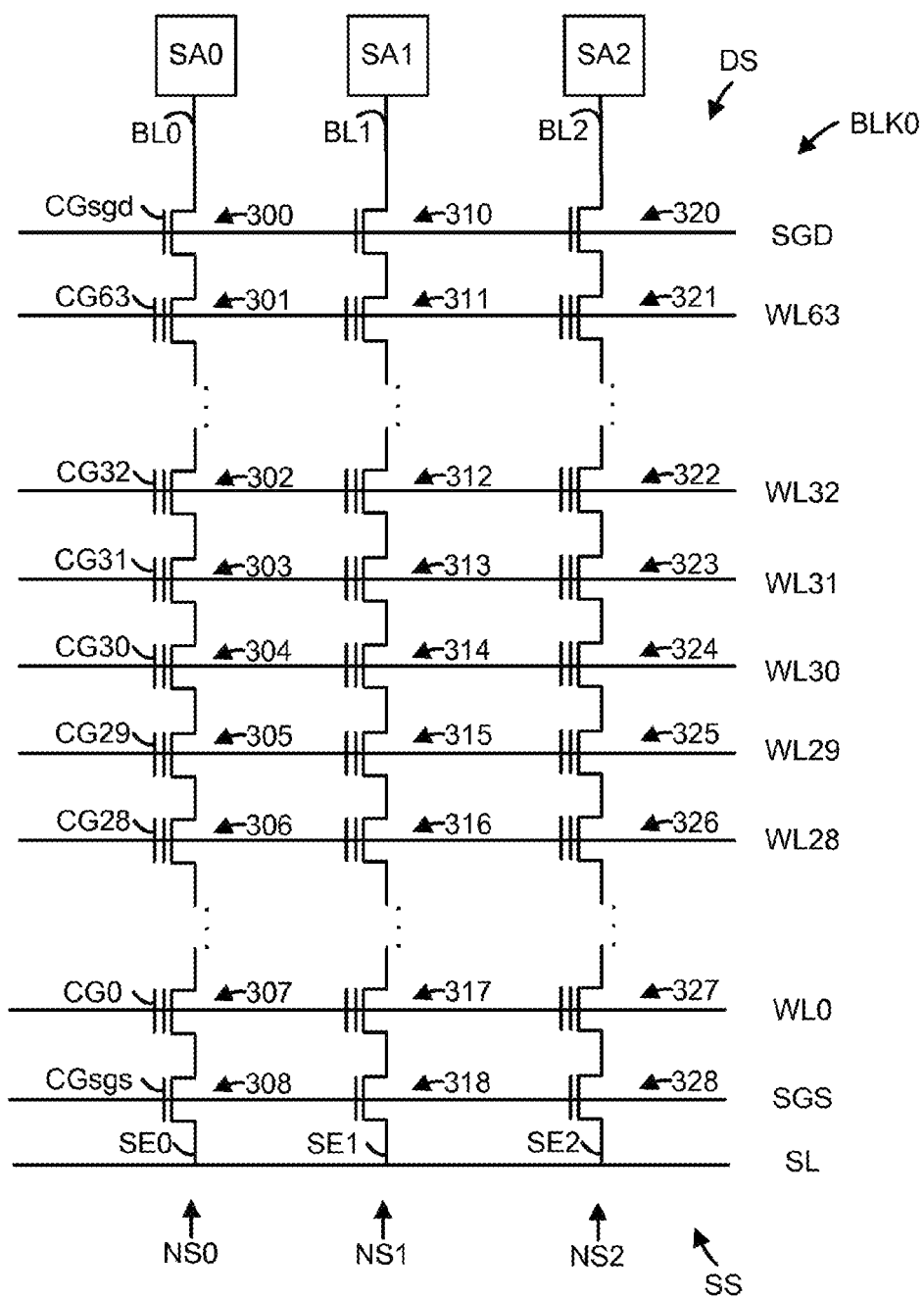
FIG. 3 depicts three example NAND strings such as shown in FIGS. 1A-2 in a block BLK0 according to aspects of the disclosure.

FIG. 3 depicts three example NAND strings such as shown in FIGS. 1A-2 in a block BLK0. BLK0 includes a number of NAND strings NS0, NS1, NS2, . . . and respective bit lines, e.g., BL0, BL1, BL2 . . . in communication with respective sense amplifiers SA0, SA1, SA2, . . . BLK0 comprises a set of non-volatile storage elements. Each NAND string is connected at one end to a select gate, drain (SGD) transistor, and the control gates of the SGD transistors are connected via a common SGD line. The NAND strings are connected at their other end to a select gate, source (SGS) transistor which, in turn, is connected to a common source line (SL). A number of word lines WL0-WL63 extend between the SGS and SGD transistors. WL0 is an edge word line which is adjacent to the source side (SS) of the block and WL63 is an edge word line which is adjacent to the drain side (DS) of the block.

An example NAND string NS0 includes storage elements 301, . . . , 302-306, . . . , 307 with respective control gates CG63, . . . CG32-CG28, . . . CG0, an SGS transistor 308 with a control gate CGsgs and a SGD transistor 300 with a control gate CGsgd. Another example NAND string NS1 includes storage elements 311, . . . , 312-316, . . . , 317, an SGS transistor 318 and a SGD transistor 310. Another example NAND string NS2 includes storage elements 321, . . . , 322-326, . . . , 327, an SGS transistor 328 and a SGD transistor 320. The NAND strings NS0, NS2, . . . are even numbered, and the NAND strings NS1, NS3 (not shown), . . . are odd numbered. Similarly, the bit lines BL0, BL2, . . . are even numbered, and the NAND strings BL1, BL3 (not shown), . . . are odd numbered. The storage elements can store user data and/or non-user data.

Figure 4:
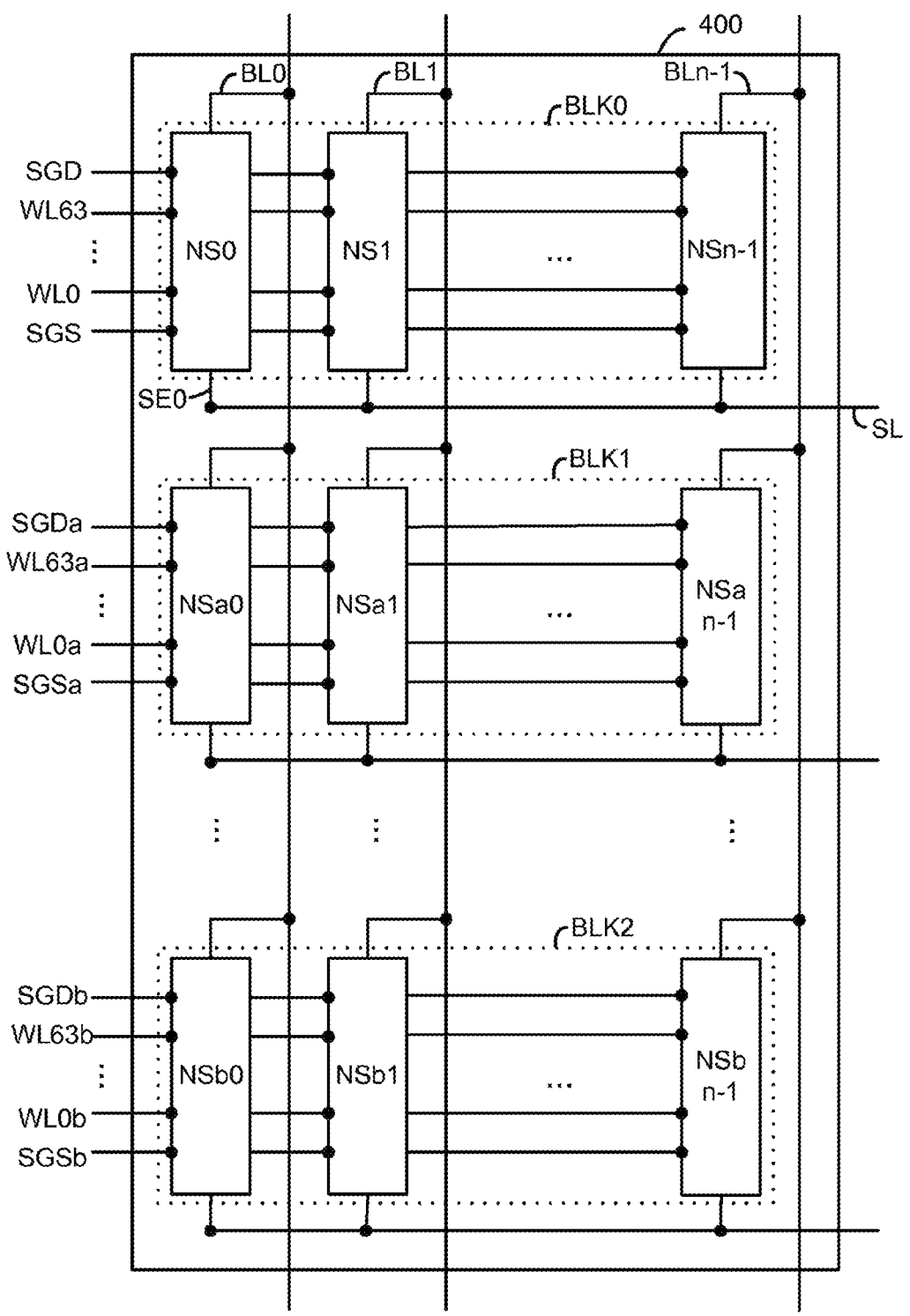
FIG. 4 is a block diagram of an array 400 of NAND flash memory cells including BLK0 of FIG. 3 and additional blocks BLK1 and BLK2 according to aspects of the disclosure.

FIG. 4 is a block diagram of an array 400 of NAND flash memory cells including BLK0 of FIG. 3 and additional blocks BLK1 and BLK2. Along each column, a bit line (BL) is coupled to the drain terminal of the drain select gate for the NAND string. Along each row of NAND strings, a source line (SL) may connect all the source terminals of the source select gates of the NAND strings (e.g., at SE0 of NS0).

The array of storage elements is divided into a large number of blocks (e.g., BLK0-BLK2) of storage elements, where each block includes a set of one or more NAND strings in communication with a common set of word lines, SGS line and SGD line. Each NAND string is also in communication with a respective bit line. For example, BLK0 includes NAND strings NS0, NS1, . . . , NSn-1 in communication with BL0, BL1, . . . BLn-1, respectively, and with WL0-WL63 SGS and SGD. BLK1 includes NAND strings NSa0, NSa1, . . . , NSan-1 in communication with BL0, BL1, . . . BLn-1, respectively, and with WL0 a-WL63 a, SGSa and SGDa. BLK2 includes NAND strings NSb0, NSb1, . . . , NSbn-1 in communication with BL0, BL1, . . . BLn-1, respectively, and with WL0 b-WL63 b, SGSb and SGDb.

As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 15-20 V) for a sufficient period of time and grounding or applying a low bias, e.g., 1 V, on the word lines of a selected block while the source and bit lines are floating. Due to capacitive cross coupling ("cross" denotes coupling from neighboring storage elements), the bit lines, select lines, and common source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells. In one embodiment, 3D NAND is erased using a different technique. 3D NAND will be further discussed below.

Figure 5A:
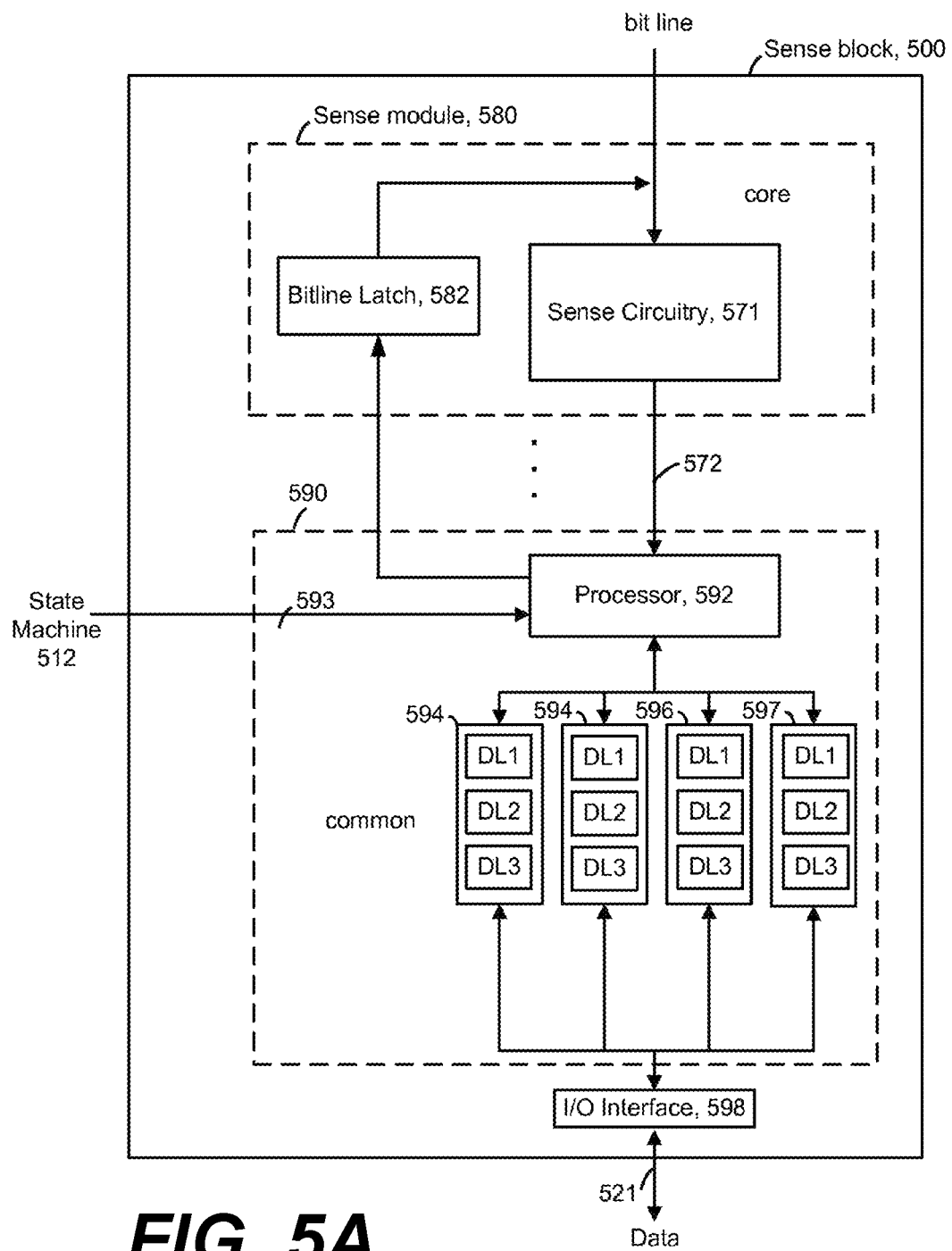
FIG. 5A is a block diagram depicting one embodiment of a sense block according to aspects of the disclosure.

FIG. 5A is a block diagram depicting one embodiment of a sense block 500. An individual sense block 500 is partitioned into a core portion, referred to as a sense module 580, and a common portion 590. In one embodiment, there is a separate sense module 580 for each bit line and one common portion 590 for a set of multiple sense modules 580. In one example, a sense block 500 will include one common portion 590 and eight sense modules 580. Each of the sense modules in a group will communicate with the associated common portion via a data bus 572.

Sense module 580 comprises sense circuitry 571 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V). As an example, a flag=0 can inhibit programming, while flag=1 does not inhibit programming.

Common portion 590 comprises a processor 592, three example sets of data latches 594 and an I/O Interface 598 coupled between the sets of data latches 594 and data bus 521. One set of data latches can be provided for each sense module, and three data latches identified by DL1, DL2, and DL3 may be provided for each set. The use of the data latches is further discussed below.

Processor 592 performs computations. For example, one of its functions is to determine the data stored in the sensed storage element and store the determined data in the set of data latches. At least some of the data latches in a set of data latches (e.g., 594) are used to store data bits determined by processor 592 during a read operation. At least some of the data latches in a set of data latches are also used to store data bits imported from the data bus 521 during a program operation. The imported data bits represent write data meant to be programmed into the memory. I/O interface 598 provides an interface between data latches 594-697 and the data bus 521.

In one embodiment, data is stored in the DL1 and DL2 latches at the beginning of the program operation. For example, lower page data may be stored in DL1 and upper page data may be stored in DL2. In one embodiment, lower page data is read from memory cells during an IDL is stored in the DL1 latches. DL3 may be used to store verify status, such as lockout status during programming. For example, when a memory cell's Vt has been verified a reaching its target level, the DL3 latch can be set to indicate this such that further programming of the memory cell may be inhibited. Note this describes programming two bits per memory cell. In one embodiment, during a read operation, the DL1 and DL2 latches are used to store the two bits that are read from the memory cell. Note that there may be more than two bits per memory cell. There can be one additional latch for each additional bit to be stored per memory cell.

During reading or other sensing, the state machine 512 controls the supply of different control gate voltages to the addressed storage element. As it steps through the various control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches (e.g., 594). In another embodiment of the core portion, bit line latch 582 serves both as a latch for latching the output of the sense module 580 and as a bit line latch as described above.

Some implementations can include multiple processors 592. In one embodiment, each processor 592 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 592 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 594-597 from the data bus 521. The program operation, under the control of the state machine, comprises a series of programming voltage pulses applied to the control gates of the addressed storage elements. Each program pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if program pulses appear on its control gate. In other embodiments, the processor initially loads the bit line latch 582 and the sense circuitry sets it to an inhibit value during the verify process.

Each set of data latch stacks 594-597 contains a stack of data latches corresponding to the sense module 580, in one embodiment. In one embodiment, there are three data latches per sense module 580. All the DL1 and DL2 data latches corresponding to the read/write block of m storage elements can be linked together to form a block shift register so that a block of data can be input or output by serial transfer.

In one embodiment, one purpose of the DL1 and DL2 latches is to store data that is to be programmed into a storage element. For example, the storage elements may store two bits per storage element. In one embodiment, lower page data is initially stored into the DL1 latches and upper page data is initially stored into the DL2 latches.

In one embodiment, the storage elements store three bits per storage element. In this case, there may be an additional data latch (not depicted in FIG. 5A) for initially storing the third bit of data that is to be programmed into a storage element. In one embodiment, the storage elements four bits per storage element, in which there may be two additional data latches (not depicted in FIG. 5A) for initially storing the third and fourth bits of data that is to be programmed into a storage element. The storage elements could store more than four bits per storage element, in which case there may be one data latch for each bit.

Additional information about the read operations and sense amplifiers can be found in (1) U.S. Pat. No. 7,196,931, "Non-Volatile Memory and Method with Reduced Source Line Bias Errors,"; (2) U.S. Pat. No. 7,023,736, "Non-Volatile Memory and Method with Improved Sensing,"; (3) U.S. Pat. No. 7,046,568, "Memory Sensing Circuit and Method for Low Voltage Operation"; (4) U.S. Pat. No. 7,196,928, "Compensating for Coupling during Read Operations of Non-Volatile Memory," and (5) U.S. Pat. No. 7,327,619, "Reference Sense Amplifier for Non-Volatile Memory". All five of the immediately above-listed patent documents are incorporated herein by reference in their entirety.

Figure 5B:
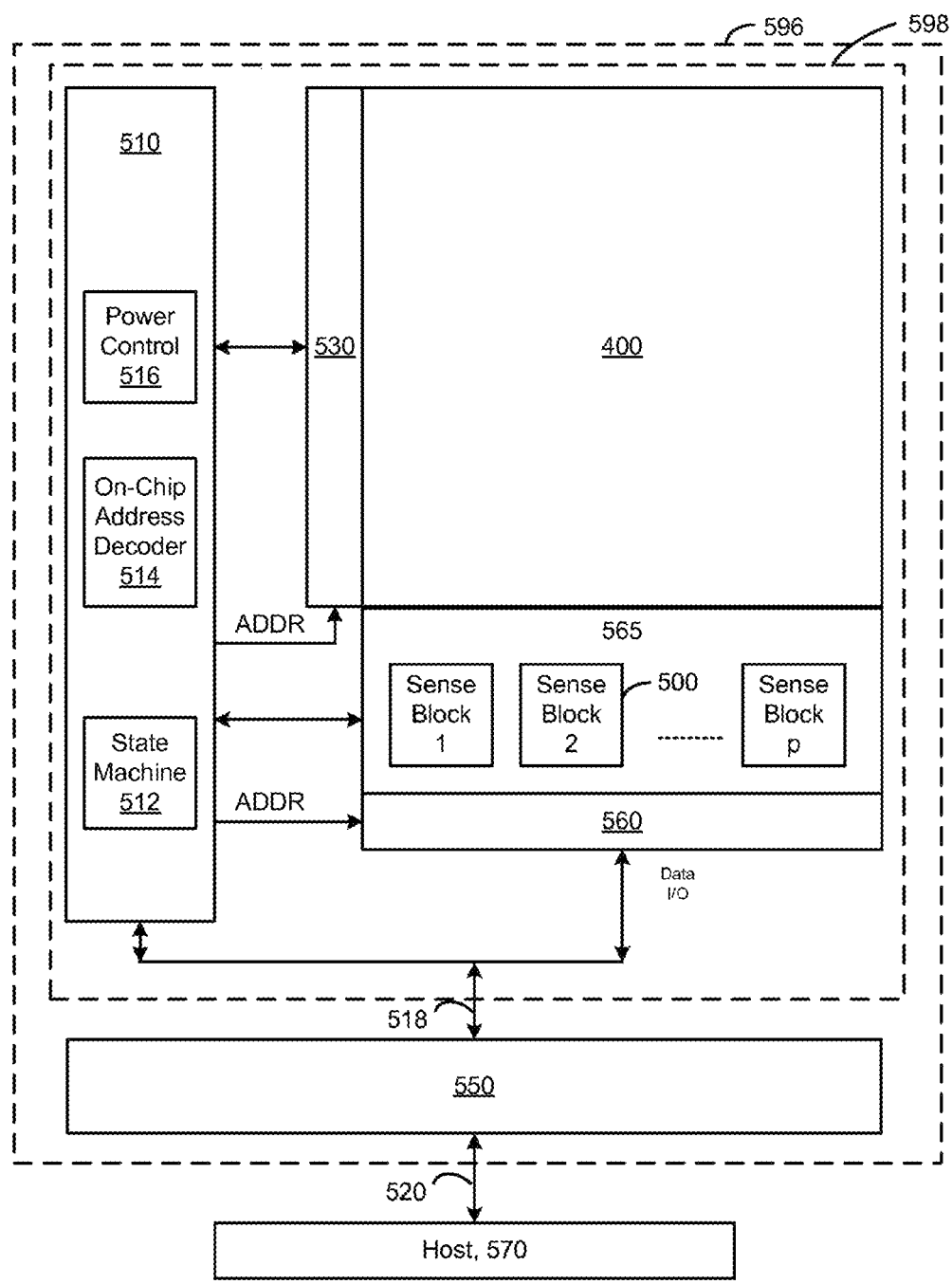
FIG. 5B is a block diagram of a non-volatile memory system which includes the array 400 of FIG. 4 according to aspects of the disclosure.

FIG. 5B is a block diagram of a non-volatile memory system which includes the array 400 of FIG. 4. The memory array 400 could include a 2D architecture or a 3D architecture. One example of a 3D architecture is a BiCS architecture. A 3D architecture may include 3D vertical NAND strings. The memory cells in 3D vertical NAND strings may include an ONO layer to store information. The information may be stored in a charge trapping layer such as, but not limited to, SiN. Note that an ONO layer can be used to store information for both 2D and 2D NAND, as well as other architectures. Thus, a floating gate may be used to store information, but is not required.

The non-volatile memory system comprises a memory device 596 having read/write circuits for reading and programming a page of memory cells in parallel, according to one embodiment of the present technology. Memory device 596 may include one or more memory die 598. Memory die 598 includes a two-dimensional array of memory cells 400, control circuitry 510, and read/write circuits 565. The memory array 400 is addressable by word lines via a row decoder 530 and by bit lines via a column decoder 560. The read/write circuits 565 include multiple sense blocks 500 and allow a page of memory cells to be read or programmed in parallel. Typically a controller 550 is included in the same memory device 596 (e.g., a removable storage card) as the one or more memory die 598. Commands and Data are transferred between the host 570 and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514 and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In another approach, dual row/column decoders and read/write circuits are used. A control circuit can be considered to comprise one or more of the components 510, 512, 514, 516, 530, 550, 560, 565, for instance.

Figure 6:
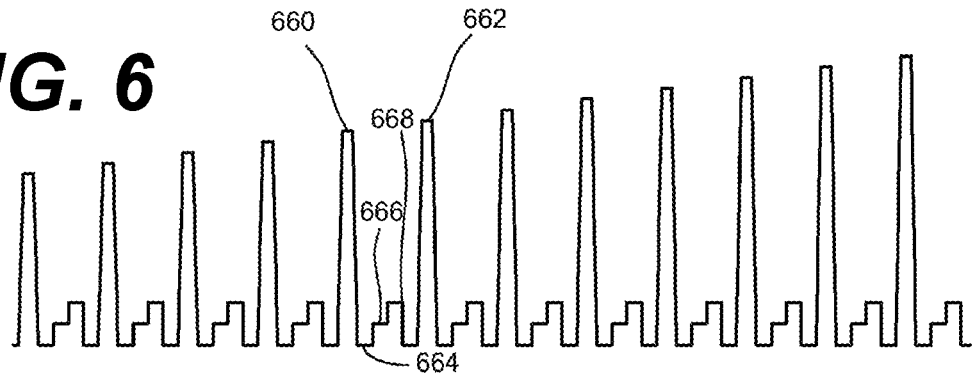
FIG. 6 depicts a program voltage signal in accordance with one embodiment according to aspects of the disclosure.

FIG. 6 depicts a program voltage signal in accordance with one embodiment. This signal has a set of pulses with increasing magnitudes. The magnitude of the pulses is increased with each pulse by a predetermined step size. In one embodiment that includes the memory cells storing multiple bits of data, an exemplary step size is 0.2 volts (or 0.4 volts). Between each of the program pulses are the verify pulses. The signal of FIG. 6 assumes a four state memory cell, therefore, it includes three verify pulses. For example, between programming pulses 660 and 662 are three sequential verify pulses. The first verify pulse 664 is depicted at a zero volt verify voltage level. The second verify pulse 666 follows the first verify pulse at the second verify voltage level. The third verify pulse 668 follows the second verify pulse 666 at the third verify voltage level. A multi-state memory cell capable of storing data in eight states may need to perform verify operations at seven compare points. Thus, seven verify pulses are applied in sequence to perform seven verify operations at seven verify levels between two consecutive programming pulses. Based on the seven verify operations, the system can determine the state of the memory cells.

Figure 7:
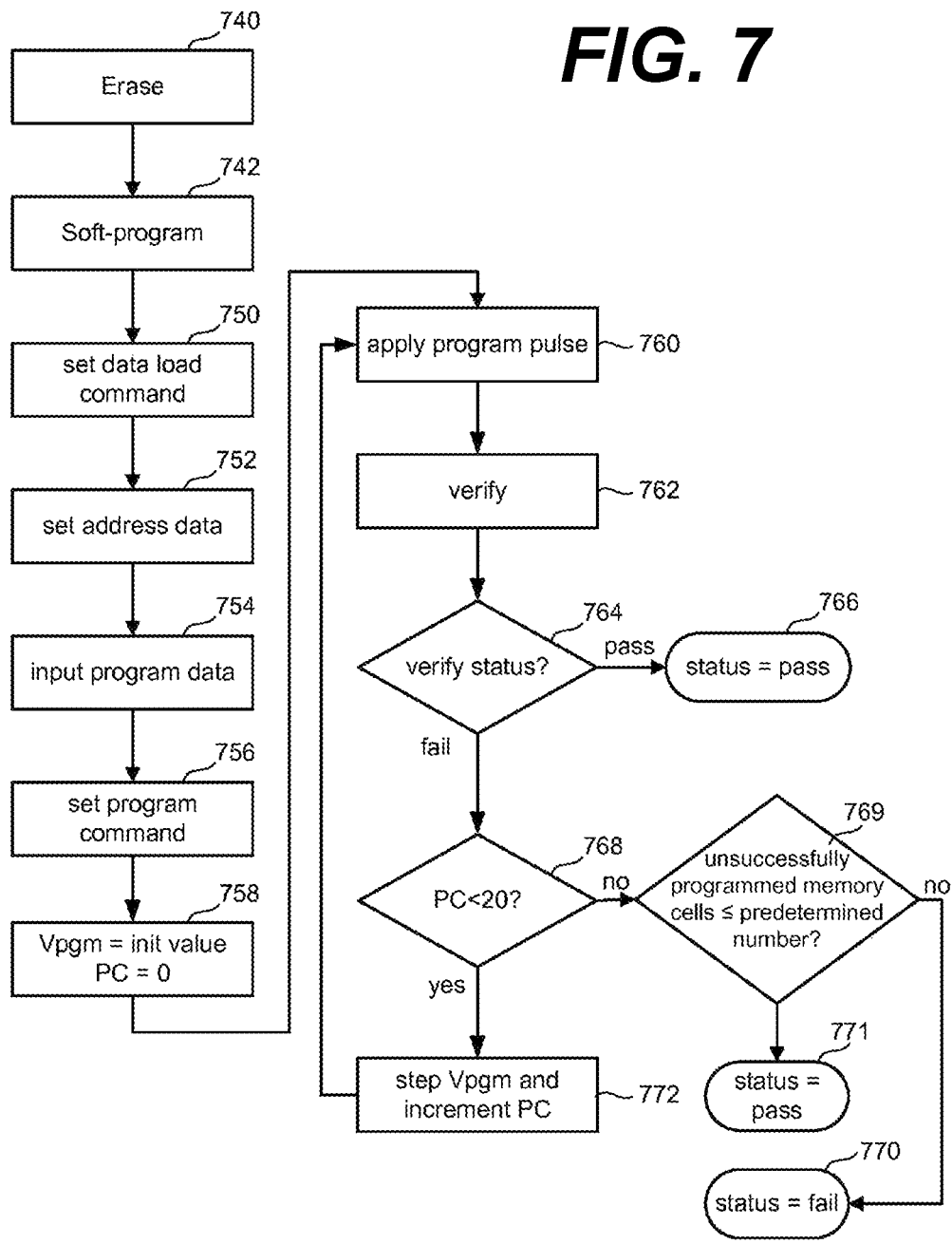
FIG. 7 is a flow chart describing one embodiment of a method for programming non-volatile memory according to aspects of the disclosure.

FIG. 7 is a flow chart describing one embodiment of a method for programming non-volatile memory. The memory cells to be programmed are erased at step 740. Step 740 can include erasing more memory cells than those to be programmed (e.g., in blocks or other units). At step 742, soft-programming is performed to narrow the distribution of erased threshold voltages for the erased memory cells. Some memory cells may be in a deeper erased state than necessary as a result of the erase process. Soft-programming can apply small programming pulses to move the threshold voltage of the erased memory cells closer to the erase verify level. At step 750 of FIG. 7, a "data load" command is issued by controller 550 and input to command circuits, allowing data to be input to data input/output buffer. At step 752, address data designating the page address is input to row controller or decoder 514 from the controller or host. The input data is recognized as the page address and latched via state machine 512, affected by the address latch signal input to command circuits. At step 754, a page of program data for the addressed page is input to data input/output buffer for programming. For example, 512 bytes of data could be input in one embodiment. That data is latched in the appropriate registers for the selected bit lines. In some embodiments, the data is also latched in a second register for the selected bit lines to be used for verify operations. At step 756, a "program" command is issued by the controller and input to data input/output buffer. The command is latched by state machine 512 via the command latch signal input to command circuits.

Triggered by the "program" command, the data latched in step 754 will be programmed into the selected memory cells controlled by state machine 512 using the stepped pulses of FIG. 6 applied to the appropriate word line. At step 758, Vpgm, the programming pulse voltage level applied to the selected word line, is initialized to the starting pulse (e.g., 12V) and a program counter PC maintained by state machine 512 is initialized at 0. At step 760, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to VDD to inhibit programming.

At step 762, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 764, it is checked whether all of the data latches are storing logic "1." If so, the programming process is complete and successful because all selected memory cells were programmed and verified to their target states. A status of "PASS" is reported at step 766.

If, at step 764, it is determined that not all of the data latches are storing logic "1," then the programming process continues. At step 768, the program counter PC is checked against a program limit value. One example of a program limit value is 20, however, other values can be used in various implementations. If the program counter PC is not less than 20, then it is determined at step 769 whether the number of bits that have not been successfully programmed is equal to or less than a predetermined number. If the number of unsuccessfully programmed bits is equal to or less than the predetermined number, then the programming process is flagged as passed and a status of pass is reported at step 771. The bits that are not successfully programmed can be corrected using error correction during the read process. If however, the number of unsuccessfully programmed bits is greater than the predetermined number, the program process is flagged as failed and a status of fail is reported at step 770. If the program counter PC is less than 20, then the Vpgm level is increased by the step size and the program counter PC is incremented at step 772. After step 772, the process loops back to step 760 to apply the next Vpgm pulse.

The flowchart of FIG. 7 depicts a single-pass programming method as can be applied for binary storage. In a two-pass programming method as can be applied for multi-level storage, for example, multiple programming or verification steps may be used in a single iteration of the flowchart. Steps 758-772 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

Figure 8A:
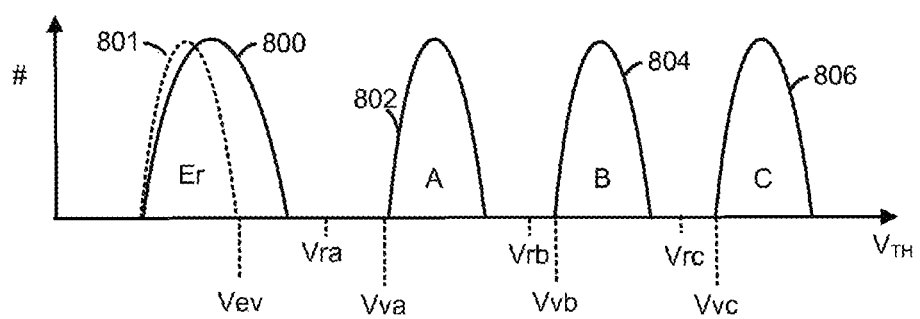
FIG. 8A illustrates exemplary threshold voltage distributions for a memory cell array when each memory cell stores two bits of data in four physical states according to aspects of the disclosure.

At the end of a successful program process, the threshold voltages of the memory cells should be within one or more distributions of threshold voltages for programmed memory cells or within a distribution of threshold voltages for erased memory cells. FIG. 8A illustrates exemplary threshold voltage distributions for a memory cell array when each memory cell stores two bits of data in four physical states. Distribution 800 represents a distribution of threshold voltages of cells that are in an erased state (storing "11"), which may have negative threshold voltage levels. Distribution 802 represents a distribution of threshold voltages of cells that are in a first programmed state ("A"), storing "10." Distribution 804 represents a distribution of threshold voltages of cells that are in a second programmed state ("B), storing "00." Distribution 806 represents a distribution of threshold voltages of cells that are in a third programmed state ("C"), storing "01."

When programming the memory cells, they may be verified using verify reference levels Vva, Vvb, and Vvc, for the A-C states respectively. When reading the memory cells, the read reference level Vra may be used to determine whether memory cells at the A-state distribution or higher. Likewise, Vrb and Vrc are read reference levels for the B- and C-states, respectively.

Note that when memory cells are initially erased, they may be erased using an erase verify level Vev, resulting in an initial erase distribution 801. The later programming of the other states may cause the upper tail of the erase distribution to shift to the right. It is possible for some of the final erase distribution 800 to be above (higher Vth) than the A-state read level.

Of course, if the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be assigned.

Memory cells are erased in one embodiment by raising the p-well to an erase voltage (e.g. 20 volts) and grounding or applying 0 volts to the word lines of a selected block while the source and bit lines are floating. Due to capacitive coupling, the unselected word lines (e.g., those in unselected, not to-be-erased blocks), bit lines, select lines, and common source lines are also raised to a high positive potential (e.g., 20V). A strong electric field is thus applied to the tunnel oxide layers of memory cells of a selected block and the data of the selected memory cells is erased as electrons of the floating gates are emitted to the substrate. Erasing refers to lowering the threshold voltage of a memory cell by transferring electrons out of its charge storage region (e.g., floating gate or charge trapping layer). For devices have a floating gate, as sufficient electrons are transferred from the floating gate to the p-well region, the threshold voltage of a selected cell becomes negative. Once the threshold voltage reaches a predetermined sufficiently low value, the memory cell can be regarded as erased and the erase process deemed completed or successful. Thus, erasing a memory cell refers to lowering the threshold voltage of a memory cell and does not imply complete or successful erasing thereof. Erasing can be performed on the entire memory array, one or more blocks of the array, or another unit of cells. The erase voltage signal Vsense is typically applied as a series of erase voltage pulses, with an erase verification operation being carried out in between each pulse. If the unit of cells being erased is not verified as erased after application of an erase voltage pulse, another erase voltage pulse can be applied to the p-well region. In some embodiments, the peak value of the erase voltage is increased for each subsequent pulse (e.g., in 1V increments from 16V to 20V).

Figure 8B:
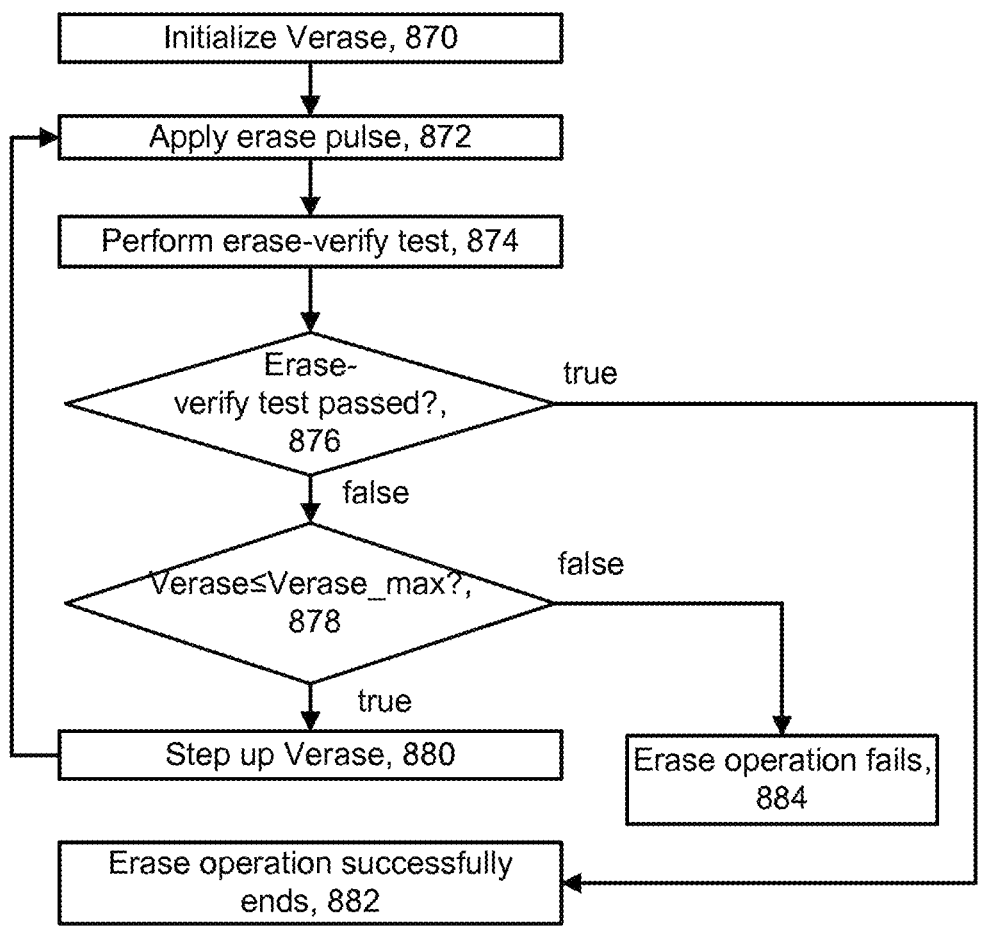
FIG. 8B depicts an example erase operation according to aspects of the disclosure.

FIG. 8B depicts an example erase operation. The steps include: Initialize Verase, 870; Apply erase pulse, 872; Perform erase-verify test, 874; Erase-verify test passed?, 876; Verase≤Verase_max?, 878; Step up Verase, 880; Erase operation successfully ends, 882; and Erase operation fails, 884. In one approach, Verase is the level of a voltage which is applied to the substrate of a block to draw electrons out of the floating gate of a storage element to thereby lower the Vth of the storage element. Performing the erase-verify test can include concurrently applying a voltage Vev to multiple word lines in a block. The erase-verify test can be performed concurrently for storage elements associated with all bit lines, even-numbered bit lines or odd-numbered bit lines.

At decision step 876, the erase-verify test is passed if the sensed storage elements have reached the erased state (e.g., their Vth is below Vev so that the sensed storage elements and their respective NAND strings are in a conductive state).

If decision step 876 is true, the erase operation successfully ends (step 882). If decision step 876 is false, Verase is stepped up and an additional erase pulse is applied, if Verase has not yet reached a maximum level, Verase_max. If decision step 876 is false and Verase has exceeded the maximum level (e.g., decision step 878 is false), the erase operation fails at step 884.

In 2D NAND memory devices, the p-well substrate is biased at a high voltage to erase the storage elements, in one embodiment. Note that the NAND strings are typically formed in the substrate, such that by applying the erase voltage to the substrate while, for example, grounding the control gates, the memory cells can be erased. In contrast, the NAND strings in a 3D stacked non-volatile memory device such as BiCS are typically not formed in a substrate.

One approach to erasing in a 3D stacked non-volatile memory device is to generate gate induced drain leakage (GIDL) current to charge up the channel, raise the channel potential to an erase voltage, and maintain this channel potential during erase. In one approach, the memory device includes NAND strings which have a drain-side select gate (SGD) transistor on one end and a source-side select gate (SGS) transistor on the other end. The erase may be a "one-sided erase" or a "two-sided erase." When an erase voltage is applied to the bit line in a one-sided erase, or to the bit line and source line in a two-sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

Figure 9:
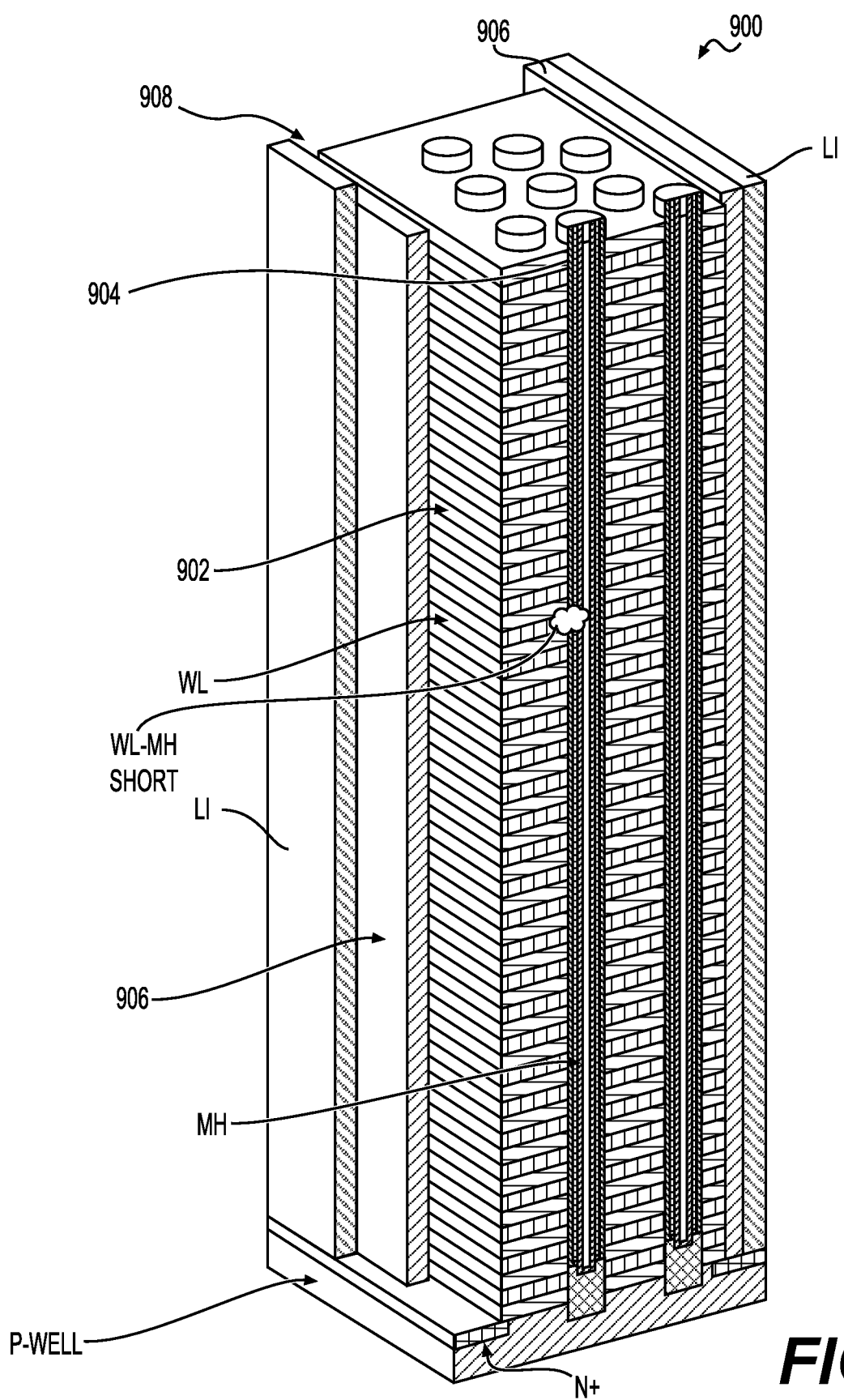
FIG. 9 shows an example word line to memory hole short circuit according to aspects of the disclosure.
Figure 10:
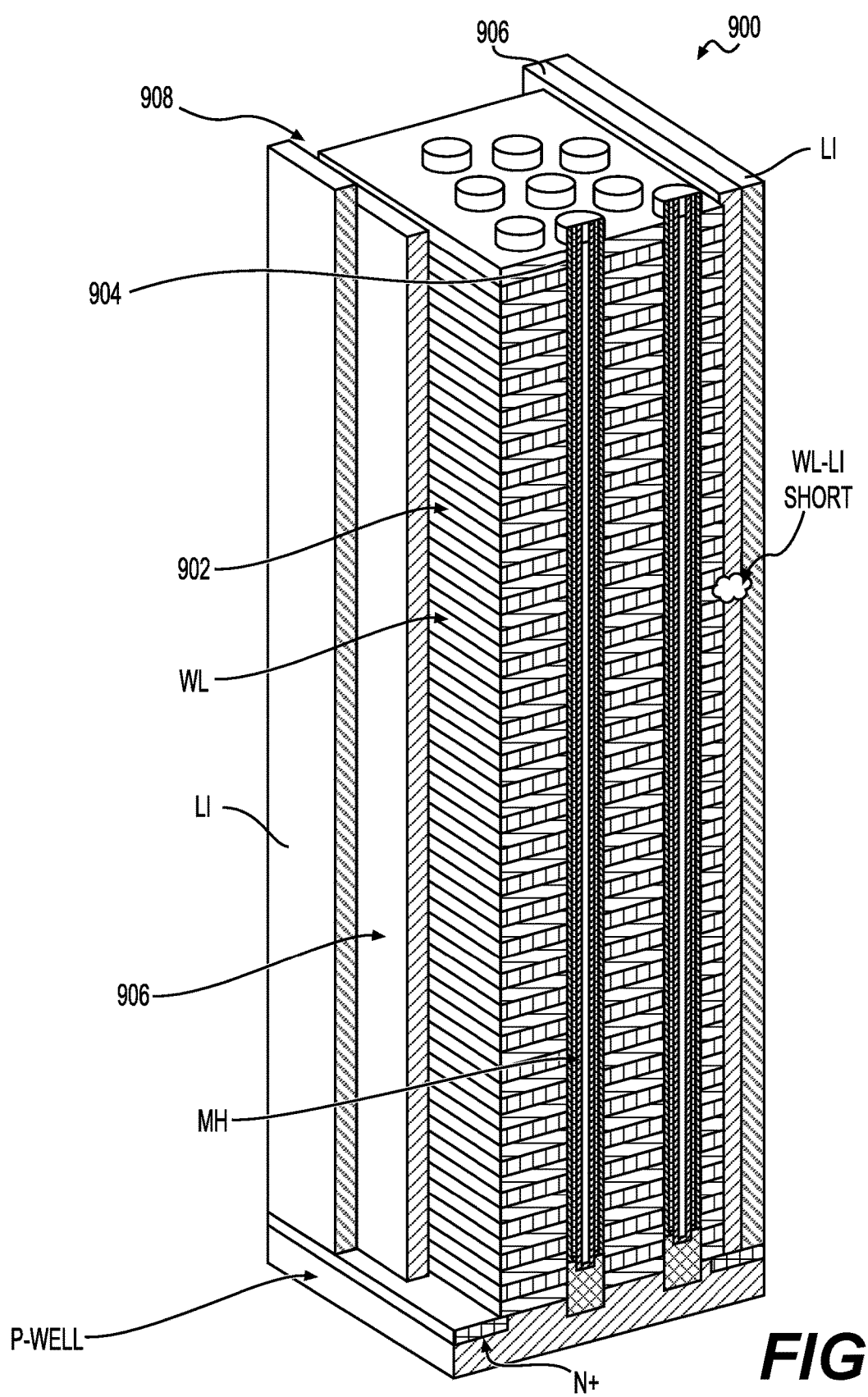
FIG. 10 shows an example word line to local interconnect short circuit according to aspects of the disclosure.

As previously discussed, short circuits may exist in between word lines and structures that form and connect to the memory cells. Specifically, referring to FIGS. 9 and 10, word line to memory hole (WL-MH) short circuits (shown in FIG. 9) and word line to local interconnect (WL-LI) short circuits (shown in FIG. 10) are very common defects. In more detail, FIG. 9 shows a perspective view of an example three dimensional non-volatile memory apparatus 900. The word lines WL are separated from one another by insulating layers 902 and the memory hole MH or channel and memory cells are formed by depositing multiple stacked dielectric memory film layers in the memory openings 904 extending through the word lines WL and insulating layers 902. An insulating material 906, such as silicon oxide, is located on the sidewalls of backside trenches 908 and conductive source lines or local interconnects LI, such as tungsten or titanium nitride/tungsten bilayer lines, are located over the insulating material 906 in the backside trenches 908 in contact with source regions n+ in the substrate P-WELL. A short circuit is shown between one of the word lines (WL) and the memory hole (MH). For instance, for the WL-MH short during an erase operation, the word line WL voltage needs to bias to a low voltage and a substrate P-WELL will go to a high voltage. If a serious WL-MH short circuit exists, the word line WL voltage will raise up to a high voltage and the erase operation will fail. During a program operation, the word line WL voltage needs to go to high and the substrate P-WELL needs to remain at a low voltage. If a serious WL-MH short circuit exists, the word line WL voltage will pull down to a lower voltage and the program operation will fail. A weak WL-MH short circuit will lead a slow to erase condition. While it may be possible for the corresponding memory cells to be successfully erased, the erase is shallower than a normal one. After the program operation, read failures may occur and such failures may be uncorrectable by error correction code due to Erase state to first programmed state disturb. Similarly, the WL-LI short is shown in FIG. 10. During the erase operation, the word line WL voltage need to bias to a low voltage and the substrate P-WELL will go to a high voltage. If a serious WL-LI short circuit exists, the word line WL voltage will raise up to a high voltage (substrate P-WELL to local interconnect LI to word line WL) then the erase operation will fail. During program operation, the WL voltage need go to high and LI needs to remain at a low voltage. If a serious WL-LI short circuit exists, the word line WL voltage will pull down to a lower voltage and the program operation will fail. Weak WL-LI short circuits will lead to a slow to erase condition, although it can pass erase, the erase is shallower than a normal one. Again, after the program operation, read failures may occur and such failures may be uncorrectable by error correction code due to Erase state to first programmed state disturb.

So, defects such as WL-MH and WL-LI short circuits can lead to all kind of basic NAND function failures type (erase, program and read). However, the occurrence of different failure types is dominated by leaky path (i.e., short circuit) severity. Solid and strong leaky paths between the word line to memory hole (WL-MH) or word line to local interconnect (WL-LI) normally lead to erase/program failures, while marginal and weak leaky path typically results in read failures, which normally cause uncorrectable error correction code (UECC) errors in the field (i.e., during customer use following manufacturing). From a field application or customer perspective, failures during erase operations are normally result in significantly less impact to the customer, since the data in the block which is going to be erased is no longer important to the customer. Firmware of the memory apparatus and at the system level error handling methods may be available to take care of program failure to prevent the data loss. The most significant failure type from the customer perspective is read failure, which can result in UECC errors after a read re-try is attempted and fails, since it will directly lead to data loss.

Figure 11:
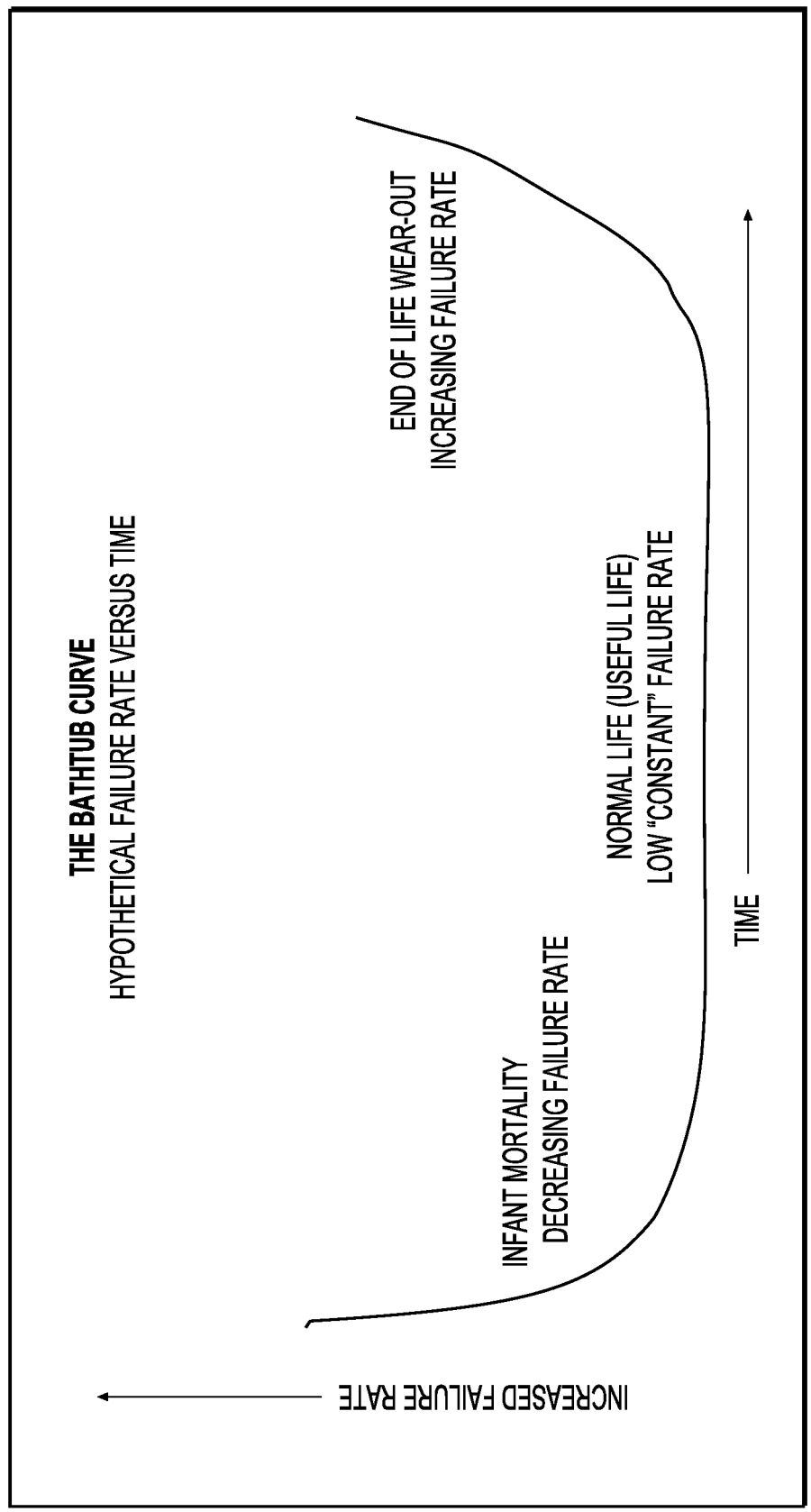
FIG. 11 illustrates hypothetical failure rates of memory apparatuses versus time according to aspects of the disclosure.

FIG. 11 illustrates a "BathTub Curve" of hypothetical failure rates of memory apparatuses versus time. Known techniques of containing WL-MH and WL-LI short circuits failure mostly rely on stress/screen in testing flow during manufacturing. The failures in early cycles (labeled infant mortality in FIG. 11) can be stressed and accelerated to pop out during the testing during manufacturing. However, some very weak WL-MH short circuits or WL-LI short circuits, which occur at middle of life cycle (labeled normal life in FIG. 11), or end of life cycle (labeled end of life wear-out in FIG. 11) are difficult to stress, accelerated, and screened while testing during manufacturing. Such very weak WL-MH short circuits or WL-LI short circuits are high potential risk to become UECC errors during the customer field application.

Thus, an apparatus (e.g., memory device 596) having a plurality of blocks (e.g., BLK0-BLK2) each including a group of non-volatile storage elements or memory cells is provided herein. Each of the group of non-volatile storage elements (e.g., array 400) stores a threshold voltage Vth representative of an element data. The apparatus also includes one or more managing circuits (e.g., control circuitry 510, controller 550, read/write circuits 565) in communication with the plurality of blocks. The one or more managing circuits are configured to erase at least one of the plurality of blocks in an erase operation and program the element data in a program operation. The one or more managing circuits are also configured to proactively identify ones of the plurality of blocks as potential bad blocks and selectively apply stress to the ones of the plurality of blocks identified as the potential bad blocks and determine whether the potential bad blocks should be retired from the erase and program operations and put in a grown bad block (GBB) pool or released to a normal block pool used for the erase and program operations based on a judgment after selectively applying the stress. Consequently, the apparatus can proactively identify the potential UECC errors and apply a countermeasure in field applications by proactively identifying potential UECC blocks, then selectively apply stress to a targeted potential bad block when the memory apparatus (e.g., 3D NAND) is in use by a customer (i.e., field application period). Thus, the data loss of UECC errors by WL-LI short circuits or WL-MH short circuits of 3D NAND, for example, can be successfully contained if it cannot be screened out during manufacturing testing.

In more detail, according to an aspect, the one or more managing circuits are configured to determine whether the element data should be corrected using an error correction code stored along with the element data and correct the element data accordingly. The one or more managing circuits are configured to determine whether an error correction quantity of the ones of the plurality of blocks corrected using the error correction code exceeds a predetermined error correction code threshold. The one or more managing circuits are also configured to monitor timing of the erase operation and the program operation and determine whether the timing of the erase operation exceeds a predetermined maximum erase time or the program operation exceeds a predetermined maximum program time. The one or more managing circuits then proactively identify the ones of the plurality of blocks as the potential bad blocks and selectively apply the stress to the ones of the plurality of blocks identified as the potential bad blocks in response to at least one trigger selected from a group consisting of a determination that the error correction quantity of the ones of the plurality of blocks corrected using the error correction code exceeds the predetermined error correction code threshold or a determination that the timing of the erase operation exceeds the predetermined maximum erase time or the program operation exceeds the predetermined maximum program time.

FIG. 12A shows threshold voltage Vth distributions for a memory cell array when each memory cell stores three bits of data in eight physical or memory states after the program operation. Although UECC errors (i.e., blocks with read failures in excess of what ECC can correct) caused by WL-MH short and WL-LI short may be able to be successfully programmed or erased, the corresponding leaky path (FIGS. 9 and 10) initially causes a gradual impact to the erase speed or program speed. Such blocks with read failures eventually degrade as erase failures or program failures over time. Therefore, there are some signals during erase or program operation can be used for indicators for proactively identify potential blocks with read failures due to WL-MH and WL-LI short circuits. Specifically, first pulse erase upper tail checking and highest program state lower tail checking (e.g., G lower tail for triple level cell/TLC, S15 lower tail for quad level cell/QLC) are used as indicators by the algorithm disclosed herein for proactive identification purposes.

As discussed, each of the plurality of blocks can be formed on and electrically coupled to a substrate (e.g., P-WELL in FIGS. 9 and 10) connected to a source line, such as source line SL in FIG. 3 (e.g., through the local interconnect (LI) in FIGS. 9 and 10) and the group of non-volatile storage elements are electrically coupled to word lines (e.g., WL0-WL63 in FIG. 3) and bit lines (e.g., BL0, BL1, BL2 in FIG. 3). The threshold voltage Vth of each of the group of non-volatile storage elements is within a common range of threshold voltages Vth defining a plurality of memory states associated with threshold voltage Vth distributions of the threshold voltage Vth (see e.g., FIG. 8A). The plurality of memory or data states includes an erased state (e.g., Er in FIG. 8A or Er in FIG. 12A) associated with the threshold voltage Vth being negative and a highest memory state (e.g., C in FIG. 8A or G in FIG. 12A) associated with the threshold voltage Vth being larger in magnitude than any others of the plurality of memory states. Consequently, the one or more managing circuits are further configured to determine the one of the plurality of blocks is successfully erased in response to the threshold voltage Vth of each of the group of non-volatile storage elements being below an erase verify level (e.g., Vev in FIG. 8A) after a plurality of erase voltage pulses are applied to the substrate through the source line while erasing the one of the plurality of blocks in the erase operation. The one or more managing circuits are also configured to determine ones of the group of non-volatile storage elements are successfully programmed to the highest memory state in response to the threshold voltage Vth of ones of the group of non-volatile storage elements sensed via the bit lines being above a highest state verify level (e.g., Vvc in FIG. 8A) after programming the element data to the group of non-volatile storage elements via the word lines in the program operation.

Figure 13:
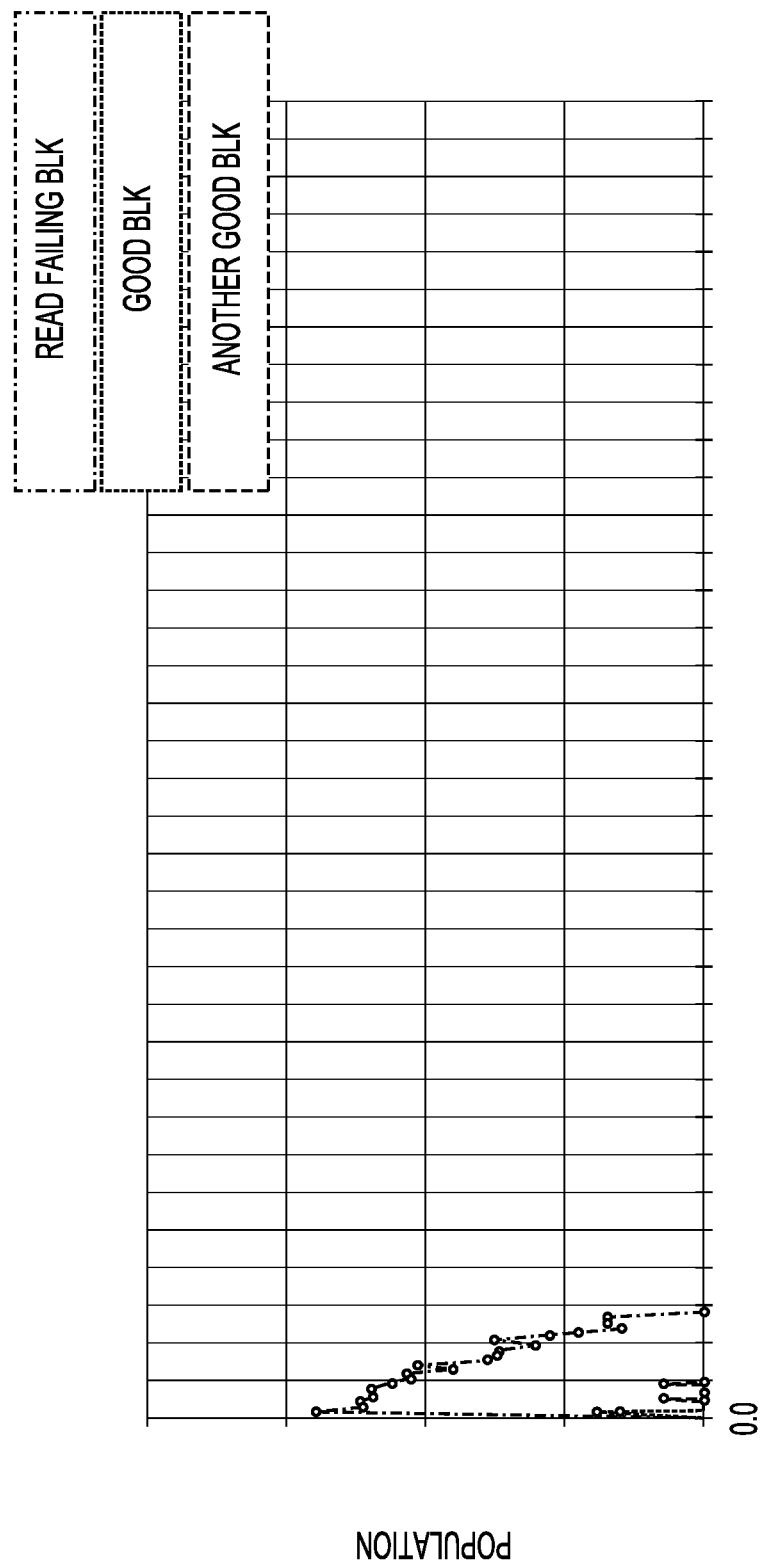
FIG. 13 shows real read failure data for a read failure block, a good block and another good block following a first erase pulse according to aspects of the disclosure.

FIGS. 12B and 12C show threshold voltage Vth distributions for a memory cell array following a first one of the plurality of erase voltage pulses used during an erase operation. As shown, for the first pulse erase upper tail checking, one extra alternative erase verify level is used to quantify an erase upper tail after the first erase pulse and normal erase verify. So, the one or more managing circuits are further configured to identify the ones of the plurality of blocks as the potential bad blocks in response to the threshold voltage Vth of an upper tail quantity of the group of non-volatile storage elements above an alternative erase verify level exceeding an alternative erase verify ignore bits threshold following a first one of the plurality of erase voltage pulses being applied to the substrate. According to an aspect, the alternative erase verify level is larger in magnitude than the erase verify level; however, it should be understood that other alternative erase verify levels may be utilized instead. If a quantity of the memory cells in the erase upper tail (erase upper tail bit) of a block is larger than an ignore bits setting of alternative erases verify, this block is proactively diagnosed as slow to erase, hence it is judged as potential bad block (FIG. 12C). Thus, the one or more managing circuits then puts the ones of the plurality of blocks identified as the potential bad blocks in a potential bad block pool. In addition, the one or more managing circuits are further configured to release the ones of the plurality of blocks to the normal block pool used for the erase and program operations in response to the threshold voltage Vth of the upper tail quantity of the group of non-volatile storage elements above the alternative erase verify level not exceeding the alternative erase verify ignore bits threshold following the first one of the plurality of erase voltage pulses being applied to the substrate (FIG. 12B). FIG. 13 shows real read failure data for a read failure block, a good block and another good block following a first erase pulse to demonstrate that the first pulse erase upper tail checking can successfully identify read failing blocks or good blocks.

Figure 14:
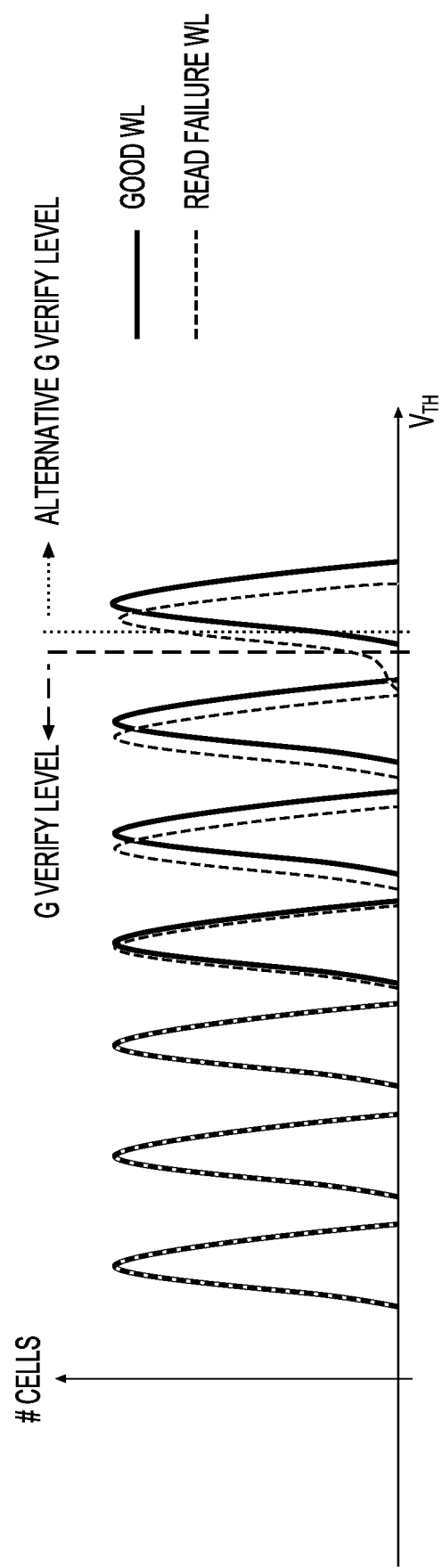
FIG. 14 shows threshold voltage distributions for a memory cell array after an extra program-verify pulse following a program operation according to aspects of the disclosure.
Figure 15:
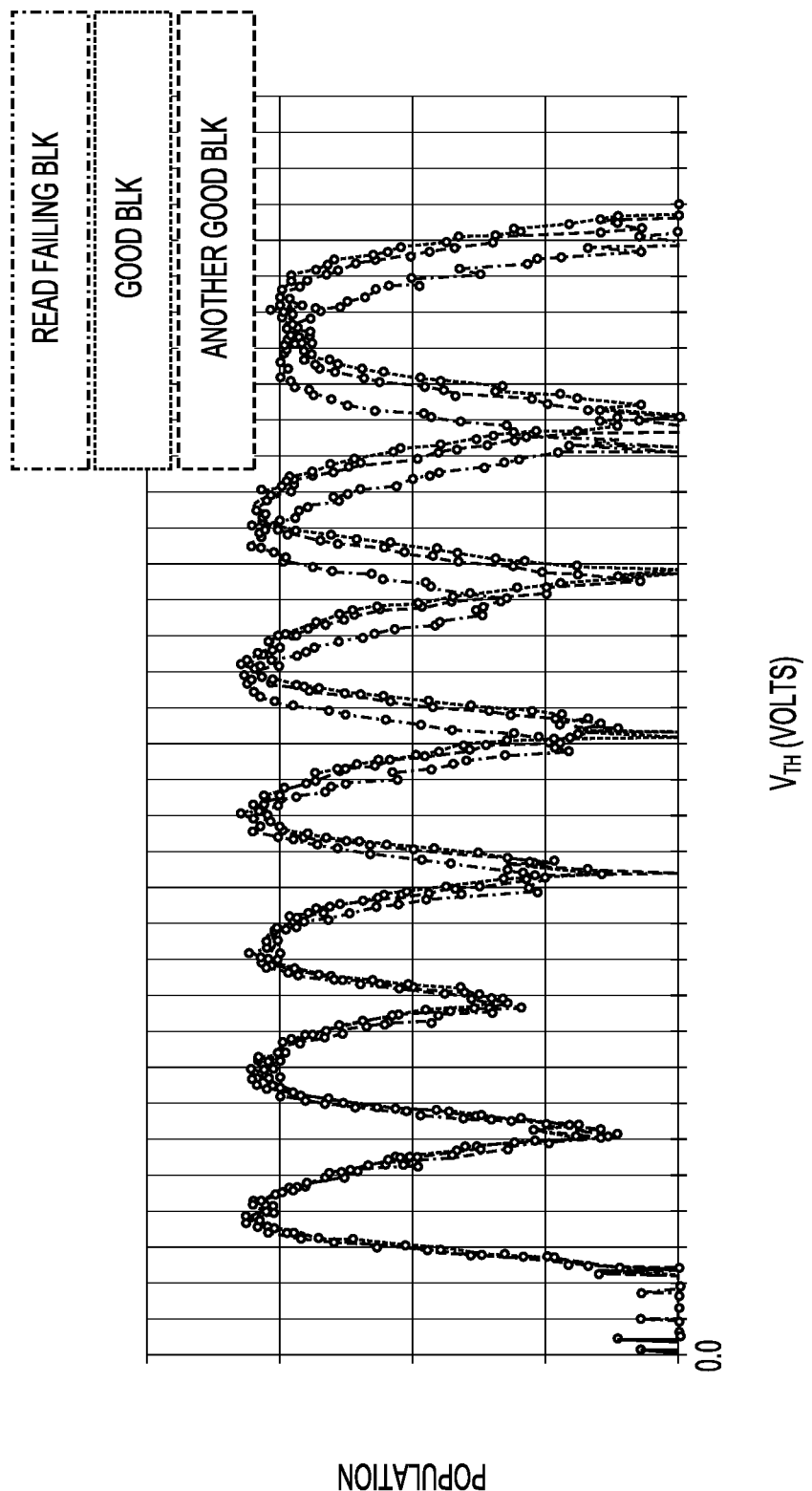
FIG. 15 shows real read failure data for a read failure block, a good block and another good block following the program operation according to aspects of the disclosure.

As mentioned above, another indicator for proactively identifying potential blocks with read failures due to WL-MH and WL-LI short circuits is highest program state lower tail checking. Specifically, once the highest program state lower tail (e.g., G lower tail for TLC, S15 lower tail for QLC) checking mode is enabled, one extra program-verify pulse is triggered with alternative highest program state verify level to measure highest program state lower tail bits after a normal program operation. FIG. 14 shows threshold voltage Vth distributions for a memory cell array after an extra program-verify pulse following the program operation. Therefore, the one or more managing circuits are further configured to apply an extra program-verify pulse to the word lines of the ones of the group of non-volatile storage elements of the ones of the plurality of blocks after the program operation and identify the ones of the plurality of blocks as the potential bad blocks (potential UECC blocks) in response to the threshold voltage Vth of a lower tail quantity of the group of non-volatile storage elements below an alternative highest state verify level exceeding an alternative program verify ignore bits threshold, the alternative highest state verify level being smaller in magnitude than the highest state verify level. If highest program state lower tail bit for a block is bigger the ignore bits setting of alternative highest program state verify, the block is diagnosed as slow to program, hence it is proactively judged as potential bad block too. Consequently, the one or more managing circuits then puts the ones of the plurality of blocks identified as the potential bad blocks in the potential bad block pool. The one or more managing circuits are also configured to release the ones of the plurality of blocks to the normal block pool used for the erase and program operations in response to the threshold voltage Vth of the lower tail quantity of the group of non-volatile storage elements below the alternative highest state verify level not exceeding the alternative program verify ignore bits threshold. FIG. 15 shows real read failure data for a read failure block, a good block and another good block following the program operation to demonstrate that the highest program state lower tail checking can successfully identify read failing blocks or good blocks.

According to another aspect, the one or more managing circuits are further configured to count the ones of the plurality of blocks identified as the potential bad blocks and determine whether a total quantity of the ones of the plurality of blocks identified as the potential bad blocks exceeds a total block count threshold. The one or more managing circuits then ends proactive identification and stressing of the potential bad blocks in response to determining the total quantity of the ones of the plurality of blocks identified as the potential bad blocks does not exceed the total block count threshold.

After the stress is selectively applied to potential UECC block, one dummy erase, program, and read cycle is done to this potential block. If an erase, program, read function failure occurs on this block during this cycle, this block will be marked as GBB (i.e., put in the grown bad block pool). If not, this block will be released as normal good block (i.e., put in the normal block pool). Thus, the one or more managing circuits are also configured to selectively apply the stress to and monitor the ones of the plurality of blocks identified as the potential bad blocks or potential UECC block in response to determining the total quantity of the ones of the plurality of blocks identified as the potential bad blocks exceeds the total block count threshold. The one or more managing circuits judges whether the potential bad blocks should be retired from the erase and program operations based on results of monitoring the ones of the plurality of blocks identified as the potential bad blocks. The one or more managing circuits then retires the potential bad blocks from the erase and program operations and put in the grown bad block pool and end proactive identification and stressing of the potential bad blocks in response to judging the potential bad blocks should be retired from the erase and program operations. In addition, the one or more managing circuits are also configured to release the potential bad blocks to the normal block pool used for the erase and program operations and end proactive identification and stressing of the potential bad blocks in response to judging the potential bad blocks should not be retired from the erase and program operations.

When selectively applying the stress to the ones of the plurality of blocks identified as the potential bad blocks, the one or more managing circuits are further configured to repeatedly erase the ones of the plurality of blocks identified as the potential bad blocks and program each of the group of non-volatile storage elements of the ones of the plurality of blocks identified as the potential bad blocks to the highest memory state in a plurality of erase program cycles until a quantity of the plurality of erase program cycles equals a predetermined cycle number. So, fast cycling between the erase operation (i.e., customer erase) and programming all memory cells to the highest program state (e.g., state G of FIG. 12A) with the predetermined cycle number of times is employed as stress for the selected potential UECC block. According to an aspect, this selective stress can done during a system background operation period when the potential bad block count (i.e., the total quantity of the ones of the plurality of blocks identified as the potential bad blocks) reaches the threshold (i.e., the total block count threshold).

Alternatively, word line to local interconnect WL-LI stress in addition to word line to memory hole WL-MH stress can also be used to stress or accelerate potential UECC blocks. So, when selectively applying the stress to the ones of the plurality of blocks identified as the potential bad blocks, the one or more managing circuits are further configured to apply a first voltage to the word lines of the ones of the group of non-volatile storage elements of the ones of the plurality of blocks identified as the potential bad blocks while simultaneously applying a second voltage being lower in magnitude than the first voltage to at least one of the source line and one of the bit lines associated with the ones of the group of non-volatile storage elements.

The one or more managing circuits can, for example, include a controller (e.g., controller 550) and a state machine (e.g., state machine 512). The state machine is configured to communicate an erase pass fail bit to the controller in response to determining the one of the plurality of blocks is successfully erased after the erase operation. In addition, the state machine is configured to communicate a program pass fail bit to the controller in response to determining the one of the plurality of blocks is successfully programmed after the program operation. The state machine is also configured to proactively identify the ones of the plurality of blocks as the potential bad blocks and communicate a potential bad block status bit to the controller based on proactively identifying the ones of the plurality of blocks as the potential bad blocks. The controller is configured to count the ones of the plurality of blocks identified as the potential bad blocks and determine whether a total quantity of the ones of the plurality of blocks identified as the potential bad blocks exceeds a total quantity threshold. The controller is also configured to instruct the state machine to selectively apply the stress to the ones of the plurality of blocks identified as the potential bad blocks in response to determining the total quantity of the ones of the plurality of blocks identified as the potential bad blocks exceeds a total block count threshold. So, the state machine will return one alternative erase status bit to reflect the proactive diagnose pass or fail associated with the first pulse erase upper tail checking (besides indicating the erase pass fail bit), then the controller (e.g., firmware) will check the alternative erase status bit as shake hand signal to know this proactively diagnose result from a device perspective. Similar to the erase proactive diagnose mode, the state machine will also return one alternative program-verify status bit to reflect the proactive diagnose pass or fail associated with the highest program state lower tail checking (besides indicating the program pass fail bit), then the controller will check the alternative program-verify status bit as shake hand signal to know this proactively diagnose result from the device perspective.

Figure 16:
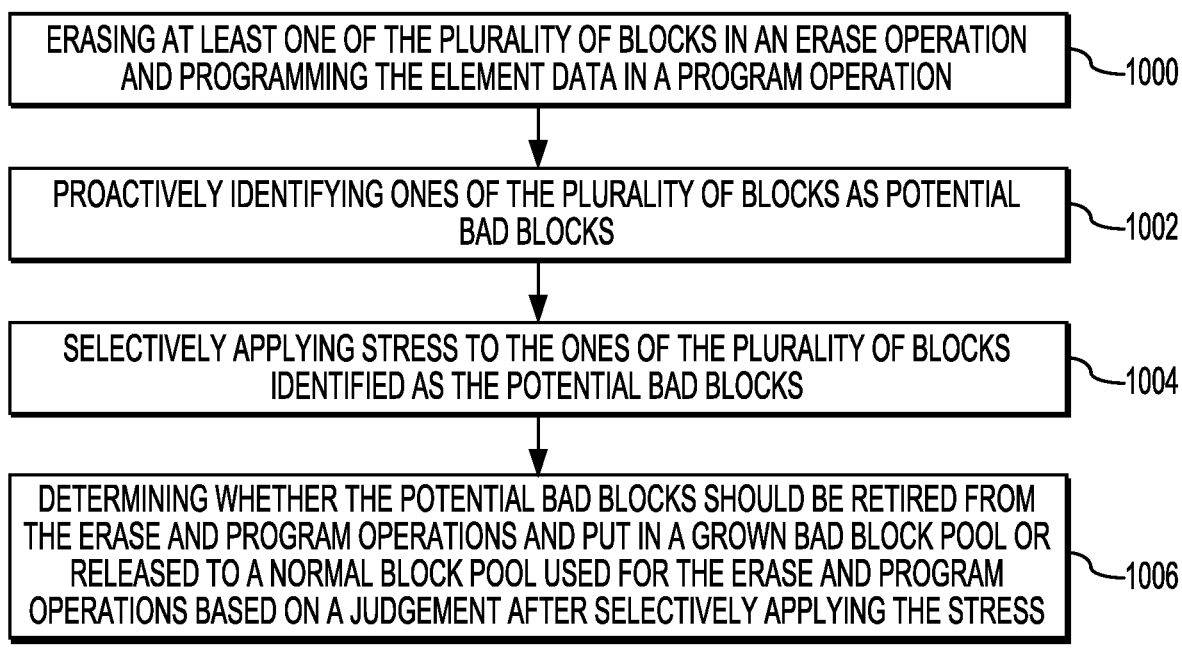
FIGS. 16 and 17 illustrate steps of a method of operating a memory apparatus according to aspects of the disclosure.
Figure 17:
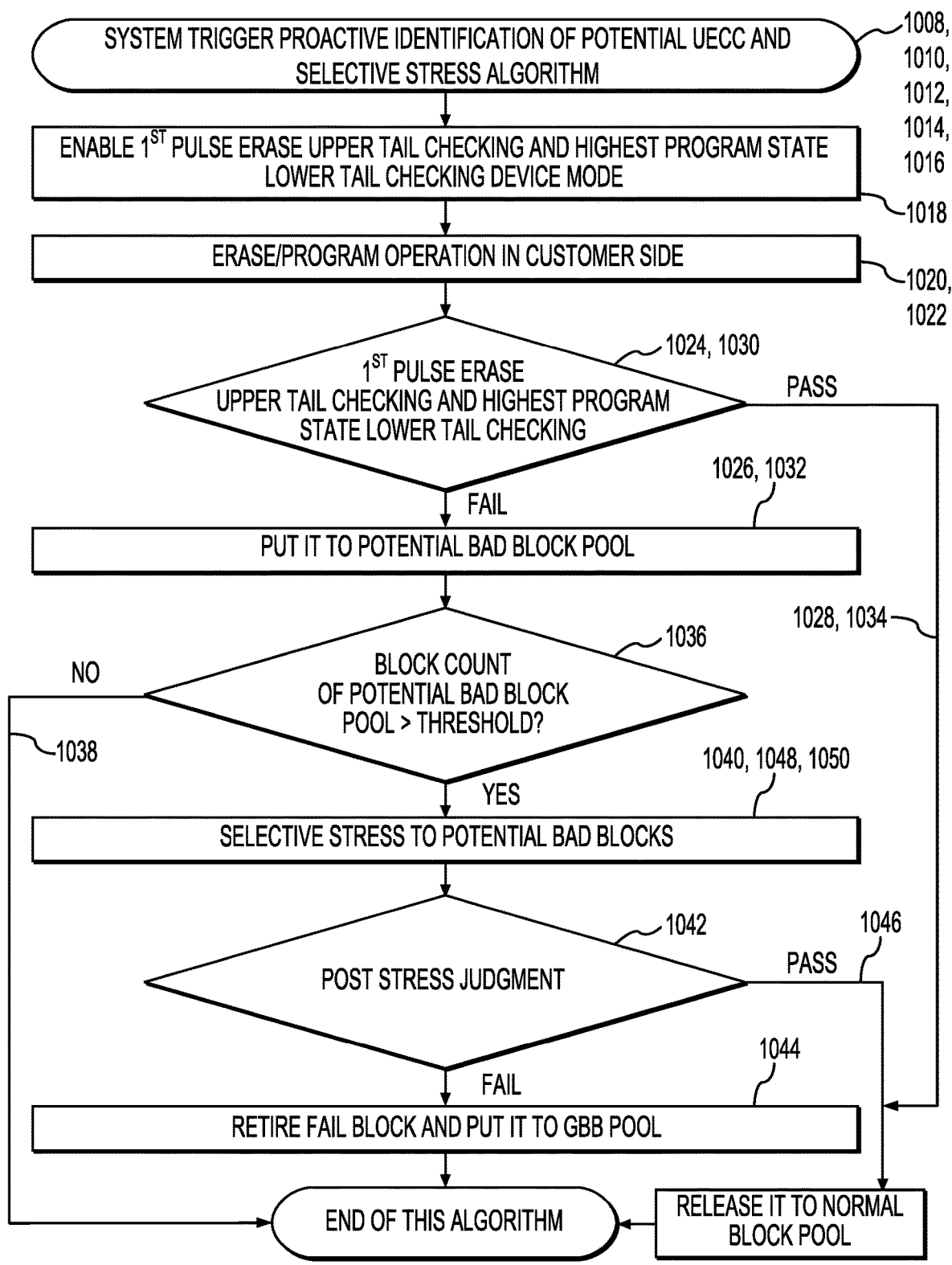

Referring now to FIGS. 16 and 17, a method of operating a memory apparatus having a plurality of blocks each including a group of non-volatile storage elements is also provided. Again, each of the group of non-volatile storage elements stores a threshold voltage Vth representative of an element data. The method includes the step of 1000 erasing at least one of the plurality of blocks in an erase operation and programming the element data in a program operation. The method continues with the step of 1002 proactively identifying ones of the plurality of blocks as potential bad blocks and 1004 selectively applying stress to the ones of the plurality of blocks identified as the potential bad blocks and 1006 determining whether the potential bad blocks should be retired from the erase and program operations and put in a grown bad block pool or released to a normal block pool used for the erase and program operations based on a judgment after selectively applying the stress.

In order to trigger the proactive identification of selective application of stress, the method can also include the step of 1008 determining whether the element data should be corrected using an error correction code stored along with the element data and correct the element data accordingly. Next, 1010 determining whether an error correction quantity of the ones of the plurality of blocks corrected using the error correction code exceeds a predetermined error correction code threshold. The method can also include the steps of 1012 monitoring timing of the erase operation and the program operation and 1014 determining whether the timing of the erase operation exceeds a predetermined maximum erase time or the program operation exceeds a predetermined maximum program time. The method can proceed with the step of 1016 proactively identify the ones of the plurality of blocks as the potential bad blocks and selectively apply the stress to the ones of the plurality of blocks identified as the potential bad blocks in response to at least one trigger selected from a group consisting of a determination that the error correction quantity of the ones of the plurality of blocks corrected using the error correction code exceeds the predetermined error correction code threshold or a determination that the timing of the erase operation exceeds the predetermined maximum erase time or the program operation exceeds the predetermined maximum program time. The method can continue with the step of 1018 enabling the first pulse erase upper tail checking and highest program state lower tail checking device mode.

Again, each of the plurality of blocks are formed on and electrically coupled to the substrate connected to the source line and the group of non-volatile storage elements are electrically coupled to word lines and bit lines and the threshold voltage Vth of each of the group of non-volatile storage elements is within the common range of threshold voltages Vth defining the plurality of memory of data states associated with threshold voltage Vth distributions of the threshold voltage Vth. Also, the plurality of memory states includes the erased state associated with the threshold voltage Vth being negative and the highest memory state associated with the threshold voltage Vth being larger in magnitude than any others of the plurality of memory states. So, the method further includes the step of 1020 determining the one of the plurality of blocks is successfully erased in response to the threshold voltage Vth of each of the group of non-volatile storage elements being below an erase verify level after a plurality of erase voltage pulses are applied to the substrate through the source line while erasing the one of the plurality of blocks in the erase operation. The method continues by 1022 determining ones of the group of non-volatile storage elements are successfully programmed to the highest memory state in response to the threshold voltage Vth of ones of the group of non-volatile storage elements sensed via the bit lines being above a highest state verify level after programming the element data to the group of non-volatile storage elements via the word lines in the program operation.

The method also includes the step of 1024 identifying the ones of the plurality of blocks as the potential bad blocks in response to the threshold voltage Cth of an upper tail quantity of the group of non-volatile storage elements above an alternative erase verify level exceeding an alternative erase verify ignore bits threshold following a first one of the plurality of erase voltage pulses being applied to the substrate, the alternative erase verify level being larger in magnitude than the erase verify level. Next, 1026 putting the ones of the plurality of blocks identified as the potential bad blocks in a potential bad block pool. The method continues by 1028 releasing the ones of the plurality of blocks to the normal block pool used for the erase and program operations in response to the threshold voltage Vth of the upper tail quantity of the group of non-volatile storage elements above the alternative erase verify level not exceeding the alternative erase verify ignore bits threshold following the first one of the plurality of erase voltage pulses being applied to the substrate. The next step of the method is 1030 applying an extra program-verify pulse to the word lines of the ones of the group of non-volatile storage elements of the ones of the plurality of blocks after the program operation and identify the ones of the plurality of blocks as the potential bad blocks in response to the threshold voltage Vth of a lower tail quantity of the group of non-volatile storage elements below an alternative highest state verify level exceeding an alternative program verify ignore bits threshold, the alternative highest state verify level being smaller in magnitude than the highest state verify level. The method also includes the step of 1032 putting the ones of the plurality of blocks identified as the potential bad blocks in the potential bad block pool. The next step of the method is 1034 releasing the ones of the plurality of blocks to the normal block pool used for the erase and program operations in response to the threshold voltage Vth of the lower tail quantity of the group of non-volatile storage elements below the alternative highest state verify level not exceeding the alternative program verify ignore bits threshold.

The method also includes the step of 1036 counting the ones of the plurality of blocks identified as the potential bad blocks and determining whether a total quantity of the ones of the plurality of blocks identified as the potential bad blocks exceeds a total block count threshold. The method proceeds with the step of 1038 ending proactive identification and stressing of the potential bad blocks in response to determining the total quantity of the ones of the plurality of blocks identified as the potential bad blocks does not exceed the total block count threshold. The method continues by 1040 selectively applying the stress to and monitoring the ones of the plurality of blocks identified as the potential bad blocks in response to determining the total quantity of the ones of the plurality of blocks identified as the potential bad blocks exceeds the total block count threshold. Next, 1042 judging whether the potential bad blocks should be retired from the erase and program operations based on results of monitoring the ones of the plurality of blocks identified as the potential bad blocks. The method also includes the step of 1044 retiring the potential bad blocks from the erase and program operations and putting in the grown bad block pool and ending proactive identification and stressing of the potential bad blocks in response to judging the potential bad blocks should be retired from the erase and program operations. In addition, the method includes the step of 1046 releasing the potential bad blocks to the normal block pool used for the erase and program operations and ending proactive identification and stressing of the potential bad blocks in response to judging the potential bad blocks should not be retired from the erase and program operations.

In more detail, the step of 1040 selectively applying the stress to and monitoring the ones of the plurality of blocks identified as the potential bad blocks in response to determining the total quantity of the ones of the plurality of blocks identified as the potential bad blocks exceeds the total block count threshold can include the step of 1048 repeatedly erasing the ones of the plurality of blocks identified as the potential bad blocks and programming each of the group of non-volatile storage elements of the ones of the plurality of blocks identified as the potential bad blocks to the highest memory state in a plurality of erase program cycles until a quantity of the plurality of erase program cycles equals a predetermined cycle number.

Alternatively, the step of 1040 selectively applying the stress to and monitoring the ones of the plurality of blocks identified as the potential bad blocks in response to determining the total quantity of the ones of the plurality of blocks identified as the potential bad blocks exceeds the total block count threshold can include the step of 1050 applying a first voltage to the word lines of the ones of the group of non-volatile storage elements of the ones of the plurality of blocks identified as the potential bad blocks while simultaneously applying a second voltage being lower in magnitude than the first voltage to at least one of the source line and one of the bit lines associated with the ones of the group of non-volatile storage elements.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. An apparatus, comprising:
a plurality of blocks each including a group of memory cells that are each configured to store a threshold voltage representative of an element data; and
one or more managing circuits in communication with the plurality of blocks and configured to:
proactively identify ones of the plurality of blocks as potential bad blocks in response to a first quantity of the group of memory cells having threshold voltages above an alternative erase verify level exceeding a first threshold following an erase operation or in response to a second quantity of the group of memory cells programmed to a highest data state having threshold voltages below an alternative highest state verify level exceeding a second threshold;

putting the ones of the plurality of blocks identified as the potential bad blocks in a potential bad block pool and releasing the ones of the plurality of blocks that were not identified as potential bad blocks to a normal block pool; and selectively apply stress to the ones of the plurality of blocks identified as the potential bad blocks and determine whether the potential bad blocks should be retired based on a judgment after selectively applying the stress.

2. The apparatus as set forth in claim 1, wherein each of the plurality of blocks are formed on and electrically coupled to a substrate connected to a source line and the group of memory cells are electrically coupled to word lines and bit lines and the threshold voltage of each of the group of memory cells is within a common range of threshold voltages defining a plurality of memory states associated with threshold voltage distributions of the threshold voltage, the plurality of memory states includes an erased state associated with the threshold voltage being negative and a highest memory state associated with the threshold voltage being larger in magnitude than any others of the plurality of memory states and the one or more managing circuits are further configured to:

determine the one of the plurality of blocks is successfully erased in response to the threshold voltage of each of the group of memory cells being below an erase verify level after a plurality of erase voltage pulses are applied to the substrate through the source line while erasing the one of the plurality of blocks in the erase operation, and determine ones of the group of memory cells are successfully programmed to the highest memory state in response to the threshold voltage of ones of the group of memory cells sensed via the bit lines being above a highest state verify level after programming the element data to the group of memory cells via the word lines in the program operation.

3. The apparatus as set forth in claim 2, wherein the one or more managing circuits are further configured to:

count the ones of the plurality of blocks identified as the potential bad blocks and determine whether a total quantity of the ones of the plurality of blocks identified as the potential bad blocks exceeds a total block count threshold, end proactive identification and stressing of the potential bad blocks in response to determining the total quantity of the ones of the plurality of blocks identified as the potential bad blocks does not exceed the total block count threshold, selectively apply the stress to and monitor the ones of the plurality of blocks identified as the potential bad blocks in response to determining the total quantity of the ones of the plurality of blocks identified as the potential bad blocks exceeds the total block count threshold, judge whether the potential bad blocks should be retired from the erase and program operations based on results of monitoring the ones of the plurality of blocks identified as the potential bad blocks, retire the potential bad blocks from the erase and program operations and put in the grown bad block pool and end proactive identification and stressing of the potential bad blocks in response to judging the potential bad blocks should be retired from the erase and program operations, and release the potential bad blocks to the normal block pool used for the erase and program operations and end proactive identification and stressing of the potential bad blocks in response to judging the potential bad blocks should not be retired from the erase and program operations.

4. The apparatus as set forth in claim 3, wherein, when selectively applying the stress to the ones of the plurality of blocks identified as the potential bad blocks, the one or more managing circuits are further configured to repeatedly erase the ones of the plurality of blocks identified as the potential bad blocks and program each of the group of memory cells of the ones of the plurality of blocks identified as the potential bad blocks to the highest memory state in a plurality of erase program cycles until a quantity of the plurality of erase program cycles equals a predetermined cycle number.

5. The apparatus as set forth in claim 3, wherein, when selectively applying the stress to the ones of the plurality of blocks identified as the potential bad blocks, the one or more managing circuits are further configured to apply a first voltage to the word lines of the ones of the group of memory cells of the ones of the plurality of blocks identified as the potential bad blocks while simultaneously applying a second voltage being lower in magnitude than the first voltage to at least one of the source line and one of the bit lines associated with the ones of the group of memory cells.

6. The apparatus as set forth in claim 2, wherein the one or more managing circuits includes a controller and a state machine and the state machine is configured to:

communicate an erase pass fail bit to the controller in response to determining the one of the plurality of blocks is successfully erased after the erase operation, communicate a program pass fail bit to the controller in response to determining the one of the plurality of blocks is successfully programmed after the program operation, and proactively identify the ones of the plurality of blocks as the potential bad blocks and communicate a potential bad block status bit to the controller based on proactively identifying the ones of the plurality of blocks as the potential bad blocks; and the controller is configured to:

count the ones of the plurality of blocks identified as the potential bad blocks and determine whether a total quantity of the ones of the plurality of blocks identified as the potential bad blocks exceeds a total quantity threshold, and instruct the state machine to selectively apply the stress to the ones of the plurality of blocks identified as the potential bad blocks in response to determining the total quantity of the ones of the plurality of blocks identified as the potential bad blocks exceeds a total block count threshold.

7. The apparatus as set forth in claim 1, wherein the one or more managing circuits are configured to:

determine whether the element data should be corrected using an error correction code stored along with the element data and correct the element data accordingly, determine whether an error correction quantity of the ones of the plurality of blocks corrected using the error correction code exceeds a predetermined error correction code threshold, monitor timing of the erase operation and the program operation, determine whether the timing of the erase operation exceeds a predetermined maximum erase time or the program operation exceeds a predetermined maximum program time, and proactively identify the ones of the plurality of blocks as the potential bad blocks and selectively apply the stress to the ones of the plurality of blocks identified as the potential bad blocks in response to at least one trigger selected from a group consisting of a determination that the error correction quantity of the ones of the plurality of blocks corrected using the error correction code exceeds the predetermined error correction code threshold or a determination that the timing of the erase operation exceeds the predetermined maximum erase time or the program operation exceeds the predetermined maximum program time.

8. A controller in communication with a memory apparatus including a plurality of blocks each including a group of non-volatile storage elements, each of the group of non-volatile storage elements storing a threshold voltage representative of an element data, the controller configured to:

proactively identify ones of the plurality of blocks as potential bad blocks in response to an upper tail quantity of the group of non-volatile storage elements having threshold voltages above an alternative erase verify level exceeding an alternative erase verify ignore bits threshold following an erase operation or in response to a lower tail quantity of the group of non-volatile storage elements below an alternative highest state verify level exceeding an alternative program verify ignore bits threshold, the alternative highest state verify level being smaller in magnitude than a highest state verify level following a program operation, put the ones of the plurality of blocks identified as the potential bad blocks in a potential bad block pool and release the ones of the plurality of blocks that were not identified as potential bad blocks to a normal block pool; and instruct the memory apparatus to selectively apply stress to the ones of the plurality of blocks identified as the potential bad blocks and determine whether the potential bad blocks should be retired based on a judgment after selectively applying the stress.

9. The controller as set forth in claim 8, wherein each of the plurality of blocks are formed on and electrically coupled to a substrate connected to a source line and the group of non-volatile storage elements are electrically coupled to word lines and bit lines and the threshold voltage of each of the group of non-volatile storage elements is within a common range of threshold voltages defining a plurality of memory states associated with threshold voltage distributions of the threshold voltage, the plurality of memory states includes an erased state associated with the threshold voltage being negative and a highest memory state associated with the threshold voltage being larger in magnitude than any others of the plurality of memory states and the controller is further configured to:

determine the one of the plurality of blocks is successfully erased in response to the threshold voltage of each of the group of non-volatile storage elements being below an erase verify level after a plurality of erase voltage pulses are applied to the substrate through the source line while erasing the one of the plurality of blocks in the erase operation, and determine ones of the group of non-volatile storage elements are successfully programmed to the highest memory state in response to the threshold voltage of ones of the group of non-volatile storage elements sensed via the bit lines being above a highest state verify level after programming the element data to the group of non-volatile storage elements via the word lines in the program operation.

10. The controller as set forth in claim 9, wherein the controller is further configured to:

count the ones of the plurality of blocks identified as the potential bad blocks and determine whether a total quantity of the ones of the plurality of blocks identified as the potential bad blocks exceeds a total block count threshold, end proactive identification and stressing of the potential bad blocks in response to determining the total quantity of the ones of the plurality of blocks identified as the potential bad blocks does not exceed the total block count threshold, instruct the memory apparatus to selectively apply the stress to and monitor the ones of the plurality of blocks identified as the potential bad blocks in response to determining the total quantity of the ones of the plurality of blocks identified as the potential bad blocks exceeds the total block count threshold, judge whether the potential bad blocks should be retired from the erase and program operations based on results of monitoring the ones of the plurality of blocks identified as the potential bad blocks, retire the potential bad blocks from the erase and program operations and put in the grown bad block pool and end proactive identification and stressing of the potential bad blocks in response to judging the potential bad blocks should be retired from the erase and program operations, and release the potential bad blocks to the normal block pool used for the erase and program operations and end proactive identification and stressing of the potential bad blocks in response to judging the potential bad blocks should not be retired from the erase and program operations.

11. The controller as set forth in claim 10, wherein, when instructing the memory apparatus to selectively apply the stress to the ones of the plurality of blocks identified as the potential bad blocks, the controller is further configured to repeatedly instruct the memory apparatus to erase the ones of the plurality of blocks identified as the potential bad blocks and program each of the group of non-volatile storage elements of the ones of the plurality of blocks identified as the potential bad blocks to the highest memory state in a plurality of erase program cycles until a quantity of the plurality of erase program cycles equals a predetermined cycle number.

12. The controller as set forth in claim 10, wherein, when instructing the memory apparatus to selectively applying the stress to the ones of the plurality of blocks identified as the potential bad blocks, the controller is further configured to instruct the memory apparatus to apply a first voltage to the word lines of the ones of the group of non-volatile storage elements of the ones of the plurality of blocks identified as the potential bad blocks while simultaneously instructing the memory apparatus to apply a second voltage being lower in magnitude than the first voltage to at least one of the source line and one of the bit lines associated with the ones of the group of non-volatile storage elements.

13. A method of operating a memory apparatus including a plurality of blocks each including a group of non-volatile storage elements, each of the group of non-volatile storage elements storing a threshold voltage representative of an element data, the method including the steps of:

proactively identifying ones of the plurality of blocks as potential bad blocks in response to an upper tail quantity of the group of non-volatile storage elements having threshold voltages above an alternate erase verify level exceeding a first threshold following an erase operation or in response to a lower tail quantity of the group of non-volatile storage elements below an alternative highest state verify level exceeding a second threshold following a program operation;

putting the ones of the plurality of blocks identified as the potential bad blocks in a potential bad block pool and releasing the ones of the plurality of blocks that were not identified as potential bad blocks to a normal block pool;

selectively applying stress to the ones of the plurality of blocks identified as the potential bad blocks; and determining whether the potential bad blocks should be retired based on a judgment after selectively applying the stress.

14. The method as set forth in claim 13, wherein each of the plurality of blocks are formed on and electrically coupled to a substrate connected to a source line and the group of non-volatile storage elements are electrically coupled to word lines and bit lines and the threshold voltage of each of the group of non-volatile storage elements is within a common range of threshold voltages defining a plurality of memory states associated with threshold voltage distributions of the threshold voltage, the plurality of memory states includes an erased state associated with the threshold voltage being negative and a highest memory state associated with the threshold voltage being larger in magnitude than any others of the plurality of memory states, the method further including the steps of:

determining the one of the plurality of blocks is successfully erased in response to the threshold voltage of each of the group of non-volatile storage elements being below an erase verify level after a plurality of erase voltage pulses are applied to the substrate through the source line while erasing the one of the plurality of blocks in the erase operation; and determining ones of the group of non-volatile storage elements are successfully programmed to the highest memory state in response to the threshold voltage of ones of the group of non-volatile storage elements sensed via the bit lines being above a highest state verify level after programming the element data to the group of non-volatile storage elements via the word lines in the program operation.

15. The method as set forth in claim 14, further including the steps of:

counting the ones of the plurality of blocks identified as the potential bad blocks and determining whether a total quantity of the ones of the plurality of blocks identified as the potential bad blocks exceeds a total block count threshold;

ending proactive identification and stressing of the potential bad blocks in response to determining the total quantity of the ones of the plurality of blocks identified as the potential bad blocks does not exceed the total block count threshold;

selectively applying the stress to and monitoring the ones of the plurality of blocks identified as the potential bad blocks in response to determining the total quantity of the ones of the plurality of blocks identified as the potential bad blocks exceeds the total block count threshold;

judging whether the potential bad blocks should be retired from the erase and program operations based on results of monitoring the ones of the plurality of blocks identified as the potential bad blocks;

retiring the potential bad blocks from the erase and program operations and putting in the grown bad block pool and ending proactive identification and stressing of the potential bad blocks in response to judging the potential bad blocks should be retired from the erase and program operations; and releasing the potential bad blocks to the normal block pool used for the erase and program operations and ending proactive identification and stressing of the potential bad blocks in response to judging the potential bad blocks should not be retired from the erase and program operations.

16. The method as set forth in claim 15, wherein the step of selectively applying the stress to and monitoring the ones of the plurality of blocks identified as the potential bad blocks in response to determining the total quantity of the ones of the plurality of blocks identified as the potential bad blocks exceeds the total block count threshold includes the step of repeatedly erasing the ones of the plurality of blocks identified as the potential bad blocks and programming each of the group of non-volatile storage elements of the ones of the plurality of blocks identified as the potential bad blocks to the highest memory state in a plurality of erase program cycles until a quantity of the plurality of erase program cycles equals a predetermined cycle number.

17. The method as set forth in claim 15, wherein the step of selectively applying the stress to and monitoring the ones of the plurality of blocks identified as the potential bad blocks in response to determining the total quantity of the ones of the plurality of blocks identified as the potential bad blocks exceeds the total block count threshold includes the step of applying a first voltage to the word lines of the ones of the group of non-volatile storage elements of the ones of the plurality of blocks identified as the potential bad blocks while simultaneously applying a second voltage being lower in magnitude than the first voltage to at least one of the source line and one of the bit lines associated with the ones of the group of non-volatile storage elements.

* * * * *